(12) United States Patent
Li et al.

(10) Patent No.: US 12,713,797 B2
(45) Date of Patent: Aug. 18, 2026

(54) SILICON-BASED ORGANIC LIGHT-EMITTING DIODES DISPLAY SUBSTRATE, MANUFACTURING METHOD THEREFOR AND SILICON-BASED ORGANIC LIGHT-EMITTING DIODES DISPLAY DEVICE

(71) Applicants: Yunnan Invensight Optoelectronics Technology Co., Ltd., Kunming (CN); BOE Technology Group Co., Ltd., Beijing (CN)

(72) Inventors: Yunlong Li, Beijing (CN); Pengcheng Lu, Beijing (CN); Xiaochuan Chen, Beijing (CN); Weiliang Bu, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 618 days.

(21) Appl. No.: 18/023,379

(22) PCT Filed: Jun. 30, 2022

(86) PCT No.: PCT/CN2022/102958

§ 371 (c)(1),
(2) Date: Feb. 27, 2023

(87) PCT Pub. No.: WO2024/000459

PCT Pub. Date: Jan. 4, 2024

(65) Prior Publication Data

US 2024/0276817 A1 Aug. 15, 2024

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/122* (2023.02); *H10K 59/88* (2023.02)

(58) Field of Classification Search
CPC .. H10K 59/1315; H10K 59/122; H10K 59/88; H10K 59/131
See application file for complete search history.

(56) References Cited

U.S. PATENT DOCUMENTS 7,511,423 B2 3/2009 Noh et al.
11,177,338 B2 * 11/2021 Kim .................... H10K 59/131
(Continued)

FOREIGN PATENT DOCUMENTS

CN 1828969 B 5/2010
CN 102222683 A 10/2011
(Continued)

*Primary Examiner* — Chad M Dicke
*Assistant Examiner* — Jeremy Daniel Watts

(57) ABSTRACT

A display substrate includes a display area and a cathode loop area, and further includes an insulating layer and a light-emitting structure layer sequentially disposed on a substrate, the light-emitting structure layer includes an anode layer, a pixel definition layer, a light-emitting layer and a cathode, the anode layer includes display anodes located in the display area and cathode voltage lines located in the cathode loop area, the cathode is connected to the cathode voltage lines; the cathode voltage lines include first cathode voltage lines extending along a first direction and second cathode voltage lines extending along a second direction, the first direction being a direction parallel to an edge of the display substrate.

19 Claims, 10 Drawing Sheets

(51) Int. Cl.
*H10K 59/122* (2023.01)
*H10K 59/88* (2023.01)

(56) References Cited

U.S. PATENT DOCUMENTS

| | | | | |
|---|---|---|---|---|
| 2005/0077814 | A1 | 4/2005 | Koo et al. | |
| 2014/0264305 | A1 | 9/2014 | Takahara | |
| 2020/0328268 | A1 | 10/2020 | Kim et al. | |
| 2020/0365681 | A1 | 11/2020 | Gunji | |
| 2022/0130330 | A1* | 4/2022 | Zhu | H10K 77/10 |
| 2022/0140021 | A1* | 5/2022 | Li | H10W 46/00 257/40 |
| 2022/0223652 | A1 | 7/2022 | Li et al. | |
| 2022/0262890 | A1 | 8/2022 | Cheng et al. | |
| 2023/0157095 | A1 | 5/2023 | Xu et al. | |
| 2023/0209899 | A1* | 6/2023 | Kim | H10K 59/1213 257/40 |
| 2023/0255074 | A1 | 8/2023 | Yu et al. | |

FOREIGN PATENT DOCUMENTS

| | | | |
|---|---|---|---|
| CN | 104040613 | A | 9/2014 |
| CN | 211150599 | U | 7/2020 |
| CN | 111834410 | A | 10/2020 |
| CN | 112271196 | A | 1/2021 |
| CN | 113284921 | A | 8/2021 |
| JP | 2009-10258 | A | 1/2009 |
| WO | 2019051977 | A1 | 3/2019 |
| WO | 2021097690 | A1 | 5/2021 |
| WO | 2021189482 | A1 | 9/2021 |
| WO | 2021189485 | A1 | 9/2021 |

* cited by examiner

SILICON-BASED ORGANIC LIGHT-EMITTING DIODES DISPLAY SUBSTRATE, MANUFACTURING METHOD THEREFOR AND SILICON-BASED ORGANIC LIGHT-EMITTING DIODES DISPLAY DEVICE

CROSS-REFERENCE TO RELATED APPLICATION

The present application is a U.S. National Phase Entry of International Application No. PCT/CN2022/102958 having an international filing date of Jun. 30, 2022. The above-identified application is hereby incorporated by reference.

TECHNICAL FIELD

Embodiments of the present disclosure relate to, but are not limited to, the field of display technology, and more particularly, to a display substrate, a manufacturing method thereof and a display device.

BACKGROUND

Micro organic light-emitting diodes (Micro OLEDs) are micro displays developed in recent years, among which there are silicon-based OLEDs. The silicon-based OLEDs can implement not only active addressing of pixels, but also manufacturing of structures such as pixel driving circuits on a silicon-based substrate, which is conducive to decrease in system volume to implement lightweight. Silicon-based OLEDs are manufactured using mature complementary metal oxide semiconductor (CMOS) integrated circuit technologies, have advantages such as small size, high pixels per inch (PPI), high refresh rate, etc., and are widely used in near-to-eye display fields of virtual reality (VR) or augmented reality (AR).

SUMMARY

The following is a summary of subject matters described herein in detail. The summary is not intended to limit the protection scope of the claims.

An embodiment of the present disclosure provides a display substrate including a substrate and a display area and a cathode loop area disposed on the substrate, wherein the cathode loop area is located outside the display area; on a plane perpendicular to the display substrate, the display substrate includes an insulating layer disposed on the substrate and a light-emitting structure layer disposed on the insulating layer, the light-emitting structure layer includes an anode layer, a pixel definition layer, an organic light-emitting layer and a cathode, the anode layer includes a plurality of display anodes located in the display area and cathode voltage lines located in the cathode loop area, the cathode is connected to the cathode voltage lines, the substrate includes a power supply electrode and pixel driving circuits, the insulating layer includes first conductive posts and second conductive posts, and the display anodes are connected to the pixel driving circuits through the first conductive posts; the cathode voltage lines include a plurality of first cathode voltage lines extending along a first direction and a plurality of second cathode voltage lines extending along a second direction, the first direction being a direction parallel to an edge of the display substrate, and the second direction intersecting the first direction; at least one second cathode voltage line is arranged between two adjacent first cathode voltage lines and connected to the two adjacent first cathode voltage lines; the cathode voltage lines are connected to the power supply electrode through the second conductive posts, and orthographic projections of the cathode voltage lines on the substrate overlay orthographic projections of the second conductive posts on the substrate.

An embodiment of the present disclosure further provides a display device including the display substrate described in any one of the embodiments of the present disclosure.

An embodiment of the present disclosure further provides a manufacturing method for a display substrate, the display substrate including a display area and a cathode loop area located outside of the display area, and the manufacturing method including:

providing a substrate, the substrate including pixel driving circuits and a power supply electrode;

forming sequentially an insulating layer and a light-emitting structure layer on the substrate, wherein the insulating layer includes first conductive posts and second conductive posts, the light-emitting structure layer includes an anode layer, a pixel definition layer, an organic light-emitting layer and a cathode, the anode layer includes display anodes located in the display area and cathode voltage lines located in the cathode loop area, the cathode is connected to the cathode voltage lines, and the display anodes are connected to the pixel driving circuits through the first conductive posts; the cathode voltage lines include a plurality of first cathode voltage lines extending along a first direction and a plurality of second cathode voltage lines extending along a second direction, the first direction being a direction parallel to an edge of the display substrate, and the second direction intersecting the first direction; at least one second cathode voltage line is arranged between two adjacent first cathode voltage lines and connected to the two adjacent first cathode voltage lines; the cathode voltage lines are connected to the power supply electrode through the second conductive posts, and orthographic projections of the cathode voltage lines on the substrate overlay orthographic projections of the second conductive posts on the substrate.

Other aspects may become clear after the accompanying drawings and the detailed description are read and understood.

BRIEF DESCRIPTION OF DRAWINGS

The accompanying drawings are intended to provide an understanding for technical schemes of the present disclosure and form a part of the specification, and are used to explain the technical schemes of the present disclosure together with embodiments of the present disclosure, and not intended to form limitations to the technical schemes of the present disclosure. The shape and size of each component in the drawings do not reflect the true proportion, and are only intended to schematically illustrate contents of the present disclosure.

FIG. 8 is a schematic view of a display substrate after a first insulating layer is formed in accordance with an embodiment of the present disclosure;

FIG. 9 is a schematic view of a display substrate after a reflective layer is formed in accordance with an embodiment of the present disclosure;

FIG. 10 is a schematic view of a display substrate after a pattern of a second insulating layer is formed in accordance with an embodiment of the present disclosure;

FIG. 11 is a schematic view of a display substrate after a pattern of an anode layer is formed in accordance with an embodiment of the present disclosure;

DETAILED DESCRIPTION

Figure 1:
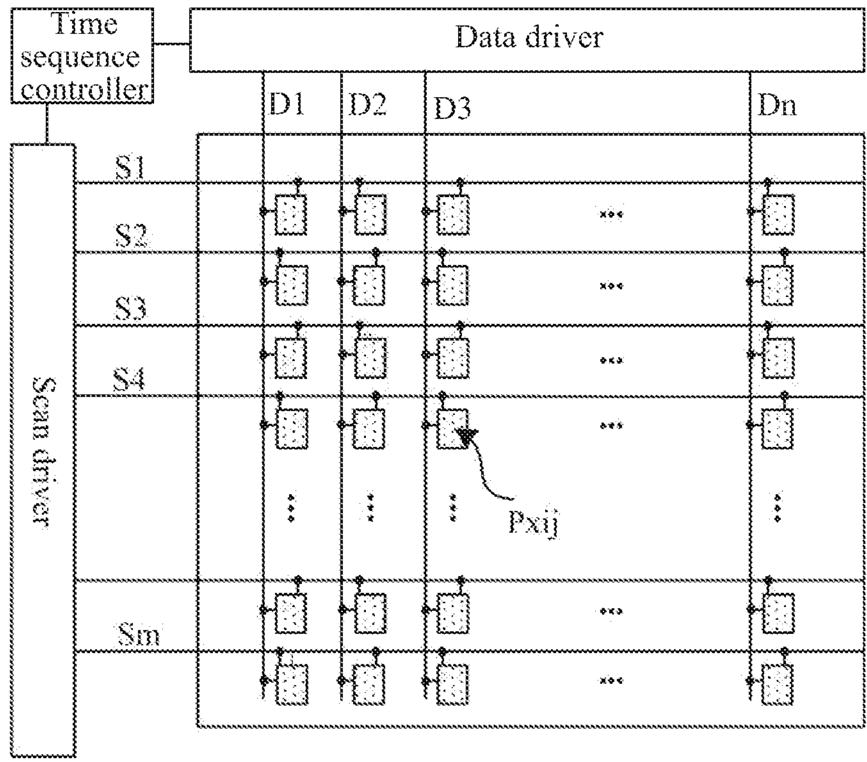
FIG. 1 is a schematic diagram of a structure of a display device of a silicon-based OLED.

In order to make objects, technical schemes and advantages of the present disclosure more clear, embodiments of the present disclosure will be described below in detail in combination with the drawings. It should be noted that embodiments may be implemented in a number of different forms. Those of ordinary skills in the art may readily understand the fact that implementations and contents can be transformed into various forms without departing from the purpose and scope of the present disclosure. Therefore, the present disclosure should not be interpreted as being limited to the contents recorded in following embodiments only. The embodiments in the present disclosure and features in the embodiments can be arbitrarily combined with each other if there are no conflicts. In order to keep the following description of the embodiments of the present disclosure clear and concise, detailed descriptions of a portion of known functions and known components are omitted in the present disclosure. The drawings of the embodiments of the present disclosure relate only to the structures involved in the embodiments of the present disclosure, and other structures may be understood with reference to conventional designs.

Scales of the drawings in the present disclosure can be used as references in the actual processes, but are not limited thereto. For embodiment, a width to length ratio of a channel, a thickness of each film layer and a spacing between two film layers, and a width of each signal line and a spacing between two signal lines can be adjusted according to actual needs. The quantity of pixels in a display device and the quantity of sub-pixels in each pixel are not limited to the quantity shown in the drawings. The drawings described in the present disclosure are a schematic structure diagram only, and one implementation of the present disclosure is not limited to the shapes or numerical values shown in the drawings.

Ordinal numerals such as “first”, “second”, “third” and the like in the specification are set in order to avoid confusion of the constituent elements, but not to set a limit in quantity.

For the sake of convenience, the terms such as “middle”, “upper”, “lower”, “front”, “back”, “vertical”, “horizontal”, “top”, “bottom”, “inside”, “outside” and the like indicating orientation or position relationships are used in the specification to illustrate position relationships between the constituent elements with reference to the drawings, and are intended to facilitate description of the specification and simplify the description, but not to indicate or imply that the mentioned device or element must have a specific orientation or be constructed and operated in a specific orientation, therefore, they should not be understood as limitations to the present disclosure. The position relationships between the constituent elements are appropriately changed according to directions of the constituent elements described. Therefore, words and phrases used in the specification are not limited and appropriate substitutions may be made according to situations.

Unless otherwise specified and defined explicitly, the terms “installed”, “coupled” and “connected” should be understood in a broad sense in the specification. For example, the connection may be a fixed connection, a detachable connection or an integrated connection, or may be a mechanical connection or an electrical connection, or may be a direct connection, an indirect connection through intermediate components, or communication inside two components. The specific meanings of the above terms in the present disclosure can be understood by a person of ordinary skill in the art according to the specific situations.

In the specification, a transistor refers to a component which at least includes three terminals, a gate electrode, a drain electrode and a source electrode. The transistor has a channel area between the drain electrode (drain electrode terminal, drain area or drain) and the source electrode (source electrode terminal, source area or source), and a current can flow through the drain electrode, the channel area and the source electrode. In the specification, the channel area refers to an area which the current flows mainly through.

In order to distinguish between two electrodes of the transistor except gate electrode, one of the two electrodes being a first electrode and the other being a second electrode are described directly in the specification. The first electrode may be a drain electrode and the second electrode may be a source electrode, or the first electrode may be a source electrode and the second electrode may be a drain electrode. In the case that transistors with opposite polarities are used or the case that a current direction is changed during circuit operation, functions of the “source electrode” and the “drain electrode” are sometimes interchangeable. Therefore, the “source electrode” and the “drain electrode” can be interchanged in the specification.

In the specification, “electrical connection” includes a case where the constituent elements are connected together through an element with a certain electrical effect. The "element with the certain electrical effect" is not particularly limited as long as electrical signals can be sent and received between the connected constituent elements. Examples of the "element with the certain electrical action" not only include an electrode and a wiring, but also include a switching element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the specification, "film" and "layer" may be interchangeable. For example, sometimes "conductive layer" may be replaced by "conductive film". Similarly, sometimes "insulating film" may be replaced by "insulating layer".

"Being disposed on the same layer" mentioned in the specification means that two (or more than two) structures are formed by patterning through the same running of patterning process, and they may be made of the same or different materials. For example, materials of the precursors forming a plurality of structures disposed on the same layer are the same, and the resulting materials may be the same or different.

Triangle, rectangle, trapezoid, pentagon and hexagon in the specification are not in the strict sense, and they may be approximate triangle, rectangle, trapezoid, pentagon or hexagon, in which there may be some small deformation caused by tolerance, and there may be chamfers, arc edges and deformation, etc.

"About" in the present disclosure means that a boundary is defined loosely and numerical values within process and measurement error ranges are allowed.

FIG. 1 is a schematic diagram of a structure of a display device of a OLED. Referring to FIG. 1, the display device of the silicon-based OLED may include a time sequence controller, a data signal driver, a scan signal driver and a pixel array. The pixel array may include a plurality of scan signal lines (S1 to Sm), a plurality of data signal lines (D1 to Dn) and a plurality of sub-pixels Pxij. In an exemplary embodiment, the time sequence controller may provide grayscale values and control signals suitable for the specification of the data signal driver to the data signal driver, and may provide clock signals and scan initial signals suitable for the specification of the scan signal driver to the scan signal driver. The data signal driver may generate data voltages to be provided to the data signal lines D1, D2, D3, . . . , and Dn using the grayscale values and the control signals that are received from the time sequence controller. For example, the data signal driver may sample the grayscale values using the clock signals and apply the data voltages corresponding to the grayscale values to the data signal lines D1 to Dn by taking a row of sub-pixels as a unit, wherein n may be a natural number. The scan signal driver may generate scan signals to be provided to the scan signal lines S1, S2, S3, . . . , and Sm by receiving the clock signals and the scan initial signals from the time sequence controller. For example, the scan signal driver may sequentially provide scan signals with on-level pulse to the scan signal lines S1 to Sm. For example, the scan signal driver may be constructed in the form of a shift register and generate the scan signals by sequentially transmitting the scan initial signals provided in the form of an on-level pulse to a next-stage circuit under the control of the clock signals, wherein m may be a natural number. A sub-pixel array may include a plurality of sub-pixels PXij. Each of the sub-pixels PXij may be connected to its corresponding data signal line and corresponding scan signal line, wherein i and j may be natural numbers. The sub-pixel Pxij may refer to a sub-pixel of which a transistor is connected to an i-th scan signal line and connected to a j-th data signal line.

Figure 2:
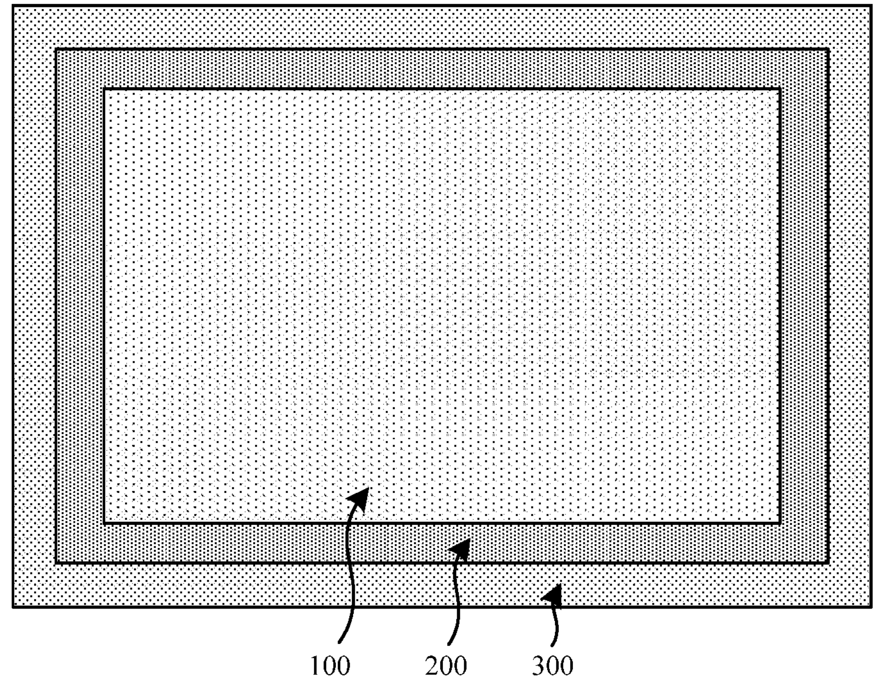
FIG. 2 is a schematic diagram of a planar structure of a display device of a silicon-based OLED.

FIG. 2 is a schematic diagram of a planar structure of a display device of a silicon-based OLED. As shown in FIG. 2, on a plane parallel to the display device of the silicon-based OLED, the display device of the silicon-based OLED may include a display area 100 and a dummy pixel area 200 located outside the display area 100. In an exemplary embodiment, the display area 100, which is an active area (AA) where images are displayed, may include a plurality of sub-pixels forming a pixel array. A sub-pixel may include a pixel driving circuit and a display light-emitting device, and the plurality of sub-pixels are configured to display dynamic pictures or static images. In an exemplary embodiment, the dummy pixel area 200, located at the periphery of the display area 100, may include a plurality of dummy light-emitting devices, which are configured to present the morphology of the display light-emitting devices but not to display images.

In an exemplary embodiment, the display device of the silicon-based OLED may further include a cathode loop area 300, which may be located at the periphery of the dummy pixel area 200, that is, the dummy pixel area 200 is located between the display area 100 and the cathode loop area 300. In an exemplary embodiment, the cathode loop area 300 may include cathode voltage lines configured to provide a common voltage (VCOM). The cathode voltage lines may form an annular structure surrounding the dummy pixel area 200, and the cathode voltage lines with the annular structure may be referred to as a cathode loop.

Figure 3:
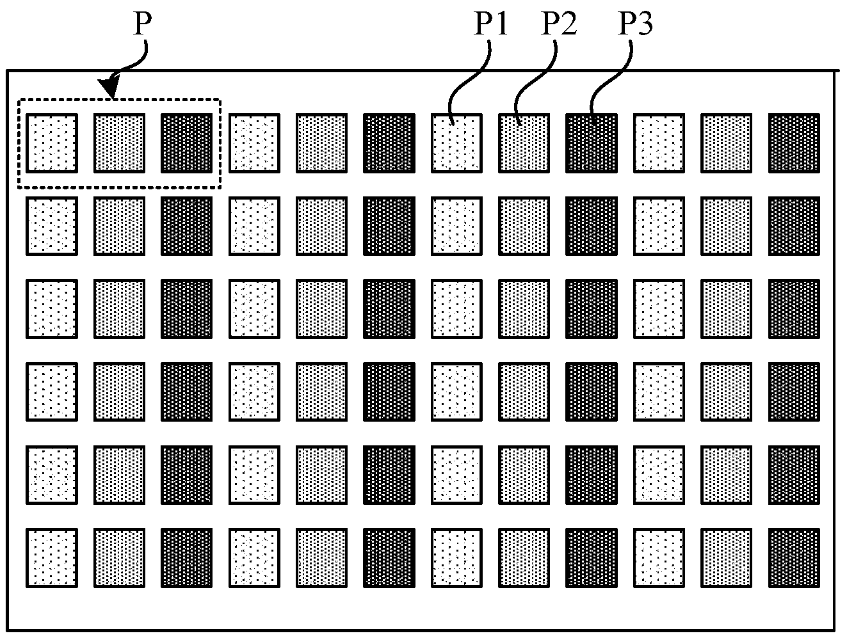
FIG. 3 is a schematic diagram of a planar structure of a display area in a display device of a silicon-based OLED.

FIG. 3 is a schematic diagram of a planar structure of a display area in a display device of a silicon-based OLED. As shown in FIG. 3, the display area may include a plurality of pixel units P arranged in a matrix, at least one of the plurality of pixel units P including a first sub-pixel P1 emitting light of a first color, a second sub-pixel P2 emitting light of a second color and a third sub-pixel P3 emitting light of a third color, and the first sub-pixel P1, the second sub-pixel P2 and the third sub-pixel P3 each including a pixel driving circuit and a light-emitting element. The pixel driving circuit in the sub-pixel is connected to a scan signal line and a data signal line, respectively. The pixel driving circuit is configured to receive a data voltage transmitted by the data signal line and output a corresponding current to the light-emitting device under control of the scan signal line. The light-emitting device in the sub-pixel is connected to the pixel driving circuit of the sub-pixel where the light-emitting device is located, and is configured to emit light of corresponding luminance in response to a current output by the pixel driving circuit of the sub-pixel where the light-emitting device is located.

In an exemplary embodiment, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary embodiment, the sub-pixels may be in the shape of any one or more of a triangle, a square, a rectangle, a rhombus, a trapezoid, a parallelogram, a pentagon, a hexagon and other polygons, and may be arranged side by side horizontally, side by side vertically, and in the shape of X, a cross, the Chinese character "pp do", a square, a diamond or a delta, the present disclosure is not limited thereto.

In an exemplary embodiment, a pixel unit may include four sub-pixels, the present disclosure is not limited thereto.

Figure 4A:
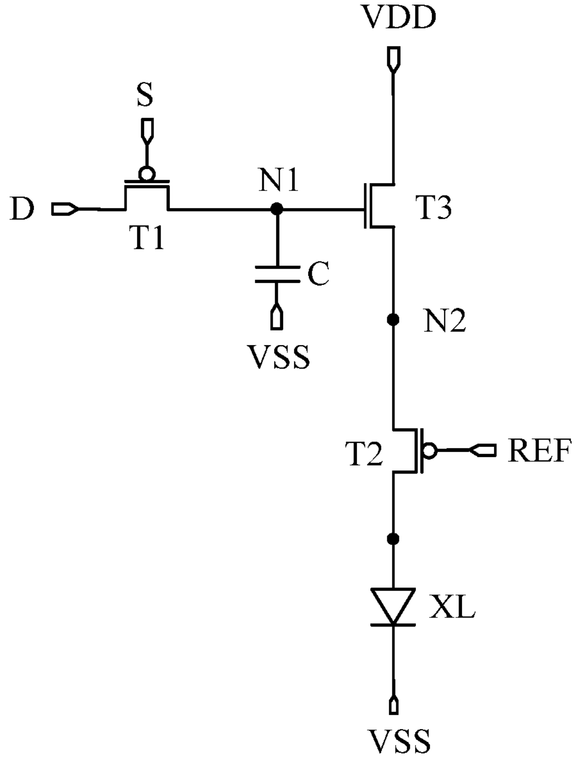
FIG. 4A is an equivalent circuit diagram of a pixel driving circuit.

FIG. 4 is an equivalent circuit diagram of a pixel driving circuit in accordance with an exemplary embodiment of the present disclosure. In an exemplary embodiment, the pixel driving circuits may be structures of 3T1C, 4T1C, 5T1C, 5T2C, 6T1C or 7T1C. As shown in FIG. 4A, a pixel driving circuit may include three transistors (a first transistor T1 through a third transistor T3) and one storage capacitor C, and the pixel driving circuit may be connected to five signal lines (a scan signal line S, a data signal line D, a reference signal line REF, a first power supply line VDD and a cathode voltage line VSS). A first node N1 and a second node N2 are points where the related electrical connections in the circuit diagram meet.

In an exemplary embodiment, a first terminal of the storage capacitor C is connected to the first node N1, and a second terminal of the storage capacitor C is connected to the cathode voltage line VSS.

In an exemplary embodiment, a control electrode of the first transistor T1 is connected to the scan signal line S, a first electrode of the first transistor T1 is connected to the data signal line D, and a second electrode of the first transistor T1 is connected to the first node N1.

In an exemplary embodiment, a control electrode of the second transistor T2 is connected to the reference signal line REF, a first electrode of the second transistor T2 is connected to the second node N2, a second electrode of the second transistor T2 is connected to a first electrode of a display light-emitting element XL, and a second electrode of the display light-emitting element XL is connected to a the cathode voltage line VSS.

In an exemplary embodiment, a control electrode of the third transistor T3 is connected to the first node N1, a first electrode of the third transistor T3 is connected to the first power supply line VDD, and a second electrode of the third transistor T3 is connected to the second node N2.

In an exemplary embodiment, signals of the first power supply line VDD may be high-level signals continuously provided, signals of the cathode voltage line VSS may be low-level signals continuously provided, and signals of the reference signal line may be low-level signals continuously provided or variable voltage signals.

In an exemplary embodiment, the first transistor T1 is configured to, under the control of a signal of the scan signal line S, receive a data voltage transmitted by the data signal line D, store the data voltage into the storage capacitor C, and provide the data voltage to the first control electrode of the third transistor T3, the second transistor T2 is configured to provide a voltage signal of the second node N2 to the first electrode of the display light-emitting device XL under the control of a signal of the reference signal line REF, and the third transistor T3 is configured to provide a signal of the first power supply line VDD to the second node N2 under the control of a signal of the first node N1 to drive the display light-emitting device XL to emit light.

In an exemplary embodiment, the first transistor T1, the second transistor T2 and the third transistor T3 may be P-type transistors. In another exemplary embodiment, the first transistor T1, the second transistor T2 and the third transistor T3 may be N-type transistors. In yet another exemplary embodiment, the first transistor T1, the second transistor T2 and the third transistor T3 may include P-type transistors and N-type transistors. For example, the first transistor T1 and the second transistor T2 may be P-type metal oxide semiconductor (PMOS) transistors, and the third transistor T3 may be a N-type metal oxide semiconductor (NMOS) transistor. In an exemplary embodiment, the display light-emitting device XL may be an OLED or a QLED, the present disclosure is not limited thereto.

In an exemplary embodiment, a plurality of pixel driving circuits may be provided in the display area and an auxiliary circuit may be provided at the periphery (e.g., the dummy pixel area or other areas) of the display area. Illustratively, the auxiliary circuit may include a reset sub-circuit, which is connected to the second node N2, a discharge signal line and an initial signal line INIT. The reset sub-circuit is configured to provide an initial voltage provided by the initial signal line to the second node N2 under the control of a signal of the discharge signal line.

Figure 4B:
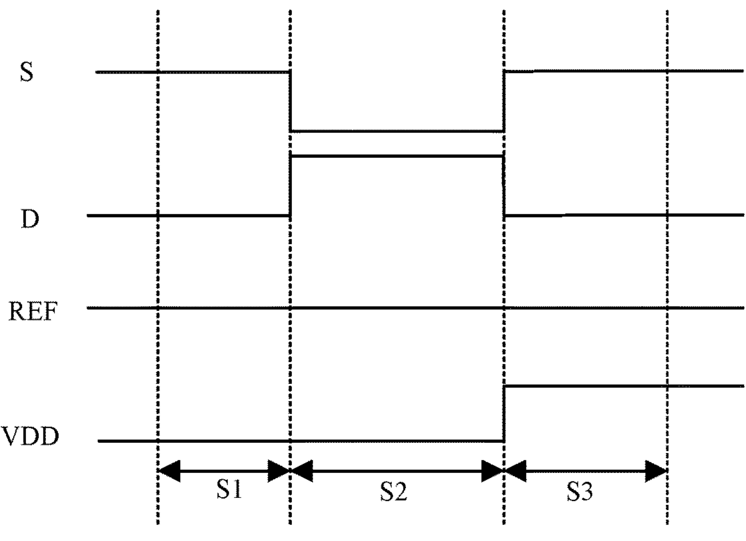
FIG. 4B is a working sequence diagram of a pixel driving circuit.

FIG. 4B is a working sequence diagram of a pixel driving circuit. An exemplary embodiment of the present disclosure will be described below through a working process of the pixel driving circuit shown in FIG. 4A. In the pixel driving circuit shown in FIG. 4A, the first transistor T1 and the second transistor T2 are P-type transistors, and the third transistor T3 is an N-type transistor.

In an exemplary embodiment, the working process of the pixel driving circuit may include the following stages.

A first stage S1 is referred to as a reset stage or an initialization stage. In this stage, the signal of the scan signal line S is a high-level signal, a signal of the data signal line D is a low-level signal, the signal of the reference signal line REF is a low-level signal, and the signal of the first power supply line VDD is a low-level signal. The reset sub-circuit provides an initial voltage to the second node N2, the low-level signal of the reference signal line REF causes the second transistor T2 of P-type to be turned on, so that the initial voltage is provided to the first electrode of the display light-emitting device XL through the turned-on second transistor T2 to initialize the display light-emitting device XL, so as to rapidly discharge (clear) charges stored in the first electrode of the display light-emitting device XL, ensure that the display light-emitting device XL does not emit light, and achieve better dynamic contrast. In this stage, the high-level signal of the scan signal line S causes the first transistor T1 of P-type to be turned off.

A second stage S2 is referred to as a data writing stage. In this stage, the signal of the scan signal line S is a low-level signal, the signal of the data signal line D is a high-level signal, the signal of the reference signal line REF is a low-level signal, and the signal of the first power supply line VDD is a low-level signal. The low-level signal of the scan signal line S causes the first transistor T1 of P-type to be turned on, and a data voltage of the data signal line D is provided to the first node N1 through the turned-on first transistor T1 to charge the storage capacitor C, so that the data voltage output from the data signal line D is stored in the storage capacitor C.

A third stage S3 is referred to as a light-emitting stage. In this stage, the signal of the scan signal line S is a high-level signal, the signal of the data signal line D is a low-level signal, the signal of the reference signal line REF is a low-level signal, and the signal of the first power supply line VDD is a high-level signal. The high-level signal of the scan signal line S causes the first transistor T1 of P-type to be turned off, and the data voltage stored in the storage capacitor C is provided to the first node N1, the potential of the first node being the data voltage of the data signal line D, so that the third transistor T3 of N-type is turned on. The low-level signal of the reference signal line REF causes the second transistor T2 of P-type to be turned on, so that the high-level signal output from the first power supply line VDD is provided to the first electrode of the display light-emitting device XL through the turned-on third transistor T3 and second transistor T2, to cause the display light-emitting device XL to emit light.

In an exemplary embodiment, in a driving process of the pixel driving circuit, a driving current flowing through the third transistor T3 (known as a driving transistor) is determined by a voltage difference between the control electrode and the first electrode of the third transistor T3. The driving current of the third transistor T3 is:

$$I = K*(Vgs - Vth)^2 = K*[(Vdd - Vdate) - Vth]^2$$

wherein I denotes the drive current flowing through the third transistor T3, K denotes a constant, Vgs denotes a voltage difference between a gate electrode and the first electrode of the third transistor T3, Vth denotes a threshold voltage of the third transistor T3, Vdate denotes the data voltage provided by the data signal line D, and Vdd denotes a power supply voltage output from the first power supply line VDD.

Figure 5:
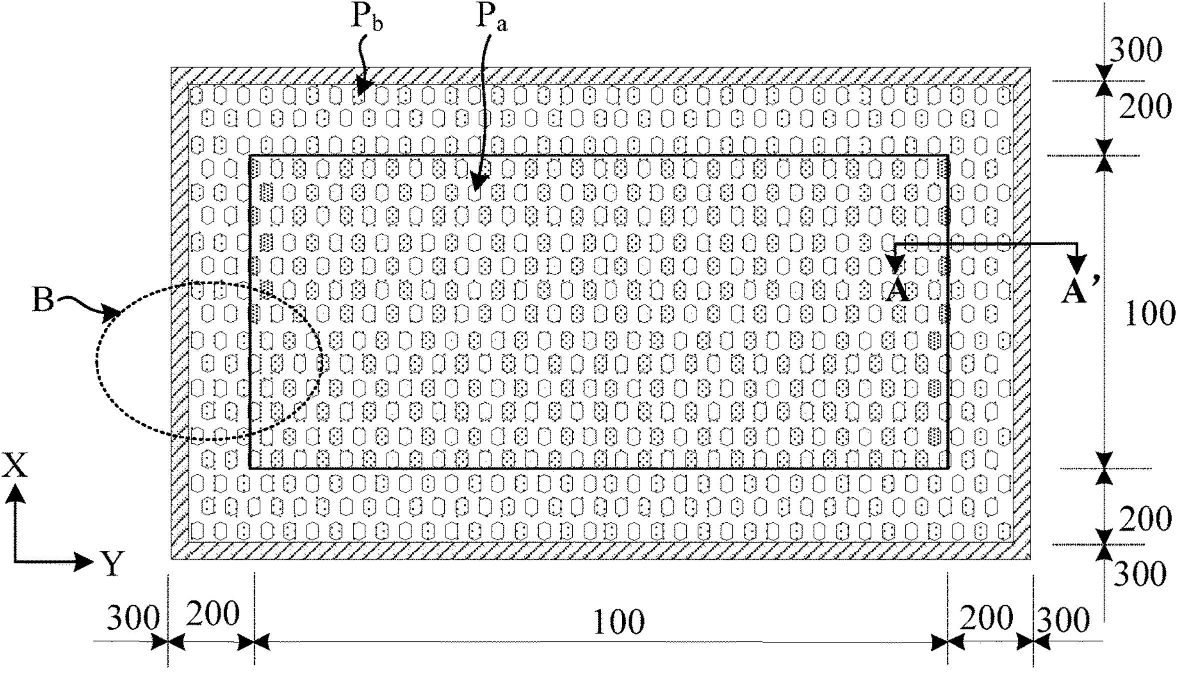
FIG. 5 is a schematic diagram of a structure of a display substrate of a silicon-based OLED in accordance with an exemplary embodiment of the present disclosure.

FIG. 5 is a schematic diagram of a structure of a display substrate of a silicon-based OLED in accordance with an exemplary embodiment of the present disclosure. As shown in FIG. 5, in an exemplary embodiment, on a plane parallel to the display substrate of the silicon-based OLED, the display substrate of the silicon-based OLED may include a display area 100, a cathode loop area 300 located at the periphery of the display area 100, and a dummy pixel area 200 located between the display area 100 and the cathode loop area 300.

In an exemplary embodiment, the display area 100 may include a plurality of pixel driving circuits and a plurality of display light-emitting devices $P_a$. A display light-emitting device $P_a$ may include a display anode, a cathode and a display light-emitting layer disposed between the display anode and the cathode. Display anodes of the plurality of display light-emitting devices $P_a$ are correspondingly connected to the plurality of pixel driving circuits.

In an exemplary embodiment, the dummy pixel area 200 may include a plurality of dummy light-emitting devices $P_b$. A dummy light-emitting device $P_b$ may include a dummy anode, a cathode and a dummy light-emitting layer disposed between the dummy anode and the cathode. Dummy anodes of the plurality of dummy light-emitting devices $P_b$ may be in a floating state without electrical connection, or both the dummy anodes and cathodes of the plurality of dummy light-emitting devices $P_b$ may be connected to the cathode voltage lines and have the same potential, so as to ensure that the dummy light-emitting devices $P_b$ will not emit light.

In an exemplary embodiment, the cathode loop area 300 may include cathode voltage lines and a cathode. The cathode voltage lines, connected to the cathode through openings in a pixel definition layer, are configured to provide a common voltage (VCOM). The cathode voltage lines may be located at one side of the dummy light-emitting devices $P_b$ away from the display area 100 and may form an annual structure surrounding the dummy light-emitting devices $P_b$. The cathode voltage lines of the annular structure can be called a cathode loop.

In some display panels, when the cathode voltage lines are connected to the cathode through the openings in the pixel definition layer, the cathode is thinned at bevel faces of sidewalls of the openings in the pixel definition layer, and its resistance increases. A lap joint structure of the cathode on the whole surface and a plurality of cathode voltage lines can be understood as a resistance series structure along a direction away from the display area, so as to further increase the cathode lap joint resistance, affect the voltage drop (IR DROP) of the display area, and will cause black screen of the display device in severe cases.

Figure 6A:
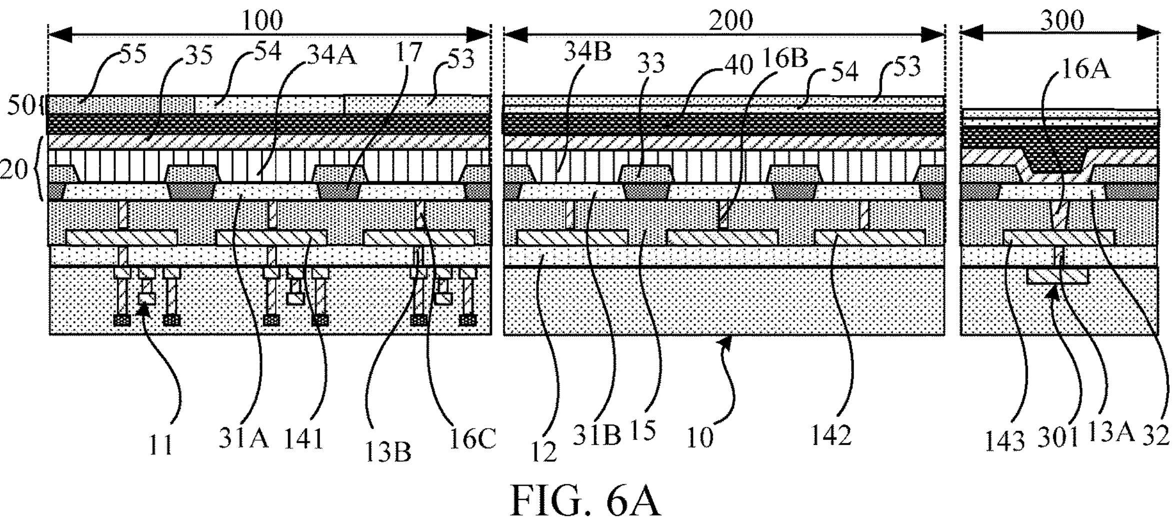
FIG. 6A is a schematic diagram of a sectional structure taken along the direction AA' in FIG. 5.

FIG. 6A is a schematic diagram of a sectional structure taken along the direction AA' in FIG. 5. FIG. 6 illustrates a display light-emitting device $P_a$ having a structure in which full color is implemented using white light plus color film. As shown in FIG. 6A, the display device of the silicon-based OLED may include: a silicon-based substrate 10, a pixel driving circuit being integrated in the silicon-based substrate 10 in the display area 100, and a power supply electrode being integrated in the silicon-based substrate 10 in the cathode loop area 300, a light-emitting structure layer 20 disposed on the silicon-based substrate 10, a first encapsulation layer 40 disposed on one side of the light-emitting structure layer 20 away from the silicon-based substrate 10, a color film structure layer 50 disposed on one side of the first encapsulation layer 40 away from the silicon-based substrate 10, a second encapsulation layer (not shown in the figure) disposed on one side of the color film structure layer 50 away from the silicon-based substrate 10, and a cover plate layer (not shown in the figure) disposed on one side of the second encapsulation layer away from the silicon-based substrate 10. In some possible implementations, the display device of the silicon-based OLED may include other film layers, the present disclosure is not limited thereto.

In an exemplary embodiment, the silicon-based substrate 10 may be a bulk silicon substrate or a silicon-on-insulator (SOI) substrate. The pixel driving circuit and a power supply circuit may be manufactured on the silicon-based substrate 10 through a silicon semiconductor process (e.g., a CMOS process), the pixel driving circuit being connected to the scan signal line and the data signal line, respectively. The pixel driving circuit may include a plurality of transistors and a storage capacitor. Only one transistor is shown as an example in FIG. 6A. The transistor may include a control electrode G, a first electrode S and a second electrode D. The control electrode G, the first electrode S and the second electrode D may be respectively connected to their corresponding connection electrodes through vias filled with wolfram metal (i.e., wolfram vias, W-via), and may be connected to other electrical structures (such as wires, etc.) through the connection electrodes.

In an exemplary embodiment, the light-emitting structure layer 20 in the display area 100 may include display anodes 31A, a pixel definition layer, a display light-emitting layer 34A and a cathode 35. The display anodes 31A may be connected to the second electrode D of the transistor through a connection electrode (first reflective electrode 141), first pixel openings, which exposes at least a portion of the display anodes 31A, are provided in the pixel definition layer, the display light-emitting layer 34A is connected to the display anodes 31A through the first pixel openings, the cathode 35 is connected to the display light-emitting layer 34A, and the display light-emitting layer 34A emits light under the driving of the display anodes 31A and the cathode 35. In an exemplary embodiment, the display light-emitting layer 34A may include an emitting layer (EML) and any one or more of a hole injection layer (HIL), a hole transport layer (HTL), an electron block layer (EBL), a hole block layer (HBL), an electron transport layer (ETL) and an electron injection layer (EIL). In an exemplary embodiment, for a light-emitting device emitting white light, display light-emitting layers 34A of all sub-pixels may be connected together to form a common layer.

In an exemplary embodiment, the light-emitting structure layer 20 in the dummy pixel area 200 may include dummy anodes 31B, a pixel definition layer, a dummy light-emitting layer 34B and a cathode 35. The dummy anodes 31B may be in a floating state without electrical connection, second pixel openings, which expose at least a portion of the dummy anodes 31B, are provided in the pixel definition layer, the dummy light-emitting layer 34B is connected to the dummy anodes 31B through the second pixel openings, and the cathode 35 is connected to the dummy light-emitting layer 34B.

In an exemplary embodiment, the light-emitting structure layer 20 in the cathode loop area 300 may include cathode voltage lines 32, a pixel definition layer and a cathode 35. A third opening, which expose at least a portion of the cathode voltage lines 32, are provided in the pixel definition layer, the cathode voltage lines 32 are connected to the cathode 35 through the third opening. The cathode voltage lines 32, connected to a power supply electrode 301 through a connection electrode (third reflective electrode 143), is configured to provide a common voltage (VCOM).

In an exemplary embodiment, the first encapsulation layer 40 and the second encapsulation layer (not shown in the figure) may be formed using thin film encapsulation (TFE), so as to ensure that external water vapor cannot enter the light-emitting structure layer, and the cover plate layer (not shown in the figure) may be made of glass or plastic colorless polyimide with flexible characteristic, etc.

In an exemplary embodiment, the color film structure layer 50 may include a black matrix (BM) and a color filter (CF). The position of the color filter may correspond to the position of the light-emitting device, the black matrix may be located between adjacent color filters, and the color filter is configured to filter white light emitted by the light-emitting device to form red (R) light, green (G) light and blue (B) light, forming red sub-pixels, green sub-pixels and blue sub-pixels.

FIGS. 6B, 6C, 6D and 6E are schematic views of four enlarged structures of an area B in FIG. 5. As shown in FIGS. 6A, 6B, 6C, 6D and 6E, the display substrate includes: the silicon-based substrate 10, an anode layer, a pixel definition layer, an organic light-emitting layer and a cathode disposed on the silicon-based substrate 10 sequentially, wherein the anode layer includes the display anodes 31A provided in the display area 100 and cathode voltage lines 32 provided in the cathode loop area 300, the cathode voltage lines 32 includes a plurality of first cathode voltage lines 320 and a plurality of second cathode voltage lines 321, and each second cathode voltage line 321 is arranged between and connected to two adjacent first cathode voltage lines 320.

In addition to the silicon-based substrate 10 of the display substrate in accordance with the embodiment of the present disclosure, substrate of other materials may be used, the embodiment of the present disclosure is not limited thereto.

Figure 6B:
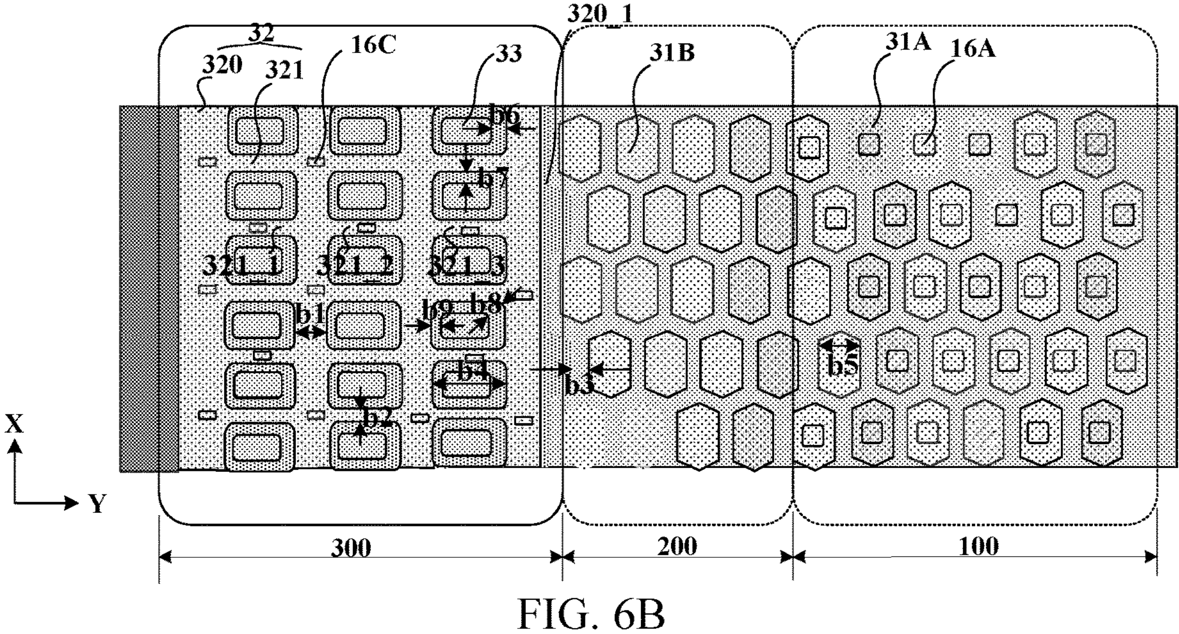
FIGS. 6B, 6C, 6D and 6E are schematic diagrams of four enlarged structures of an area B in FIG. 5.
Figure 6C:
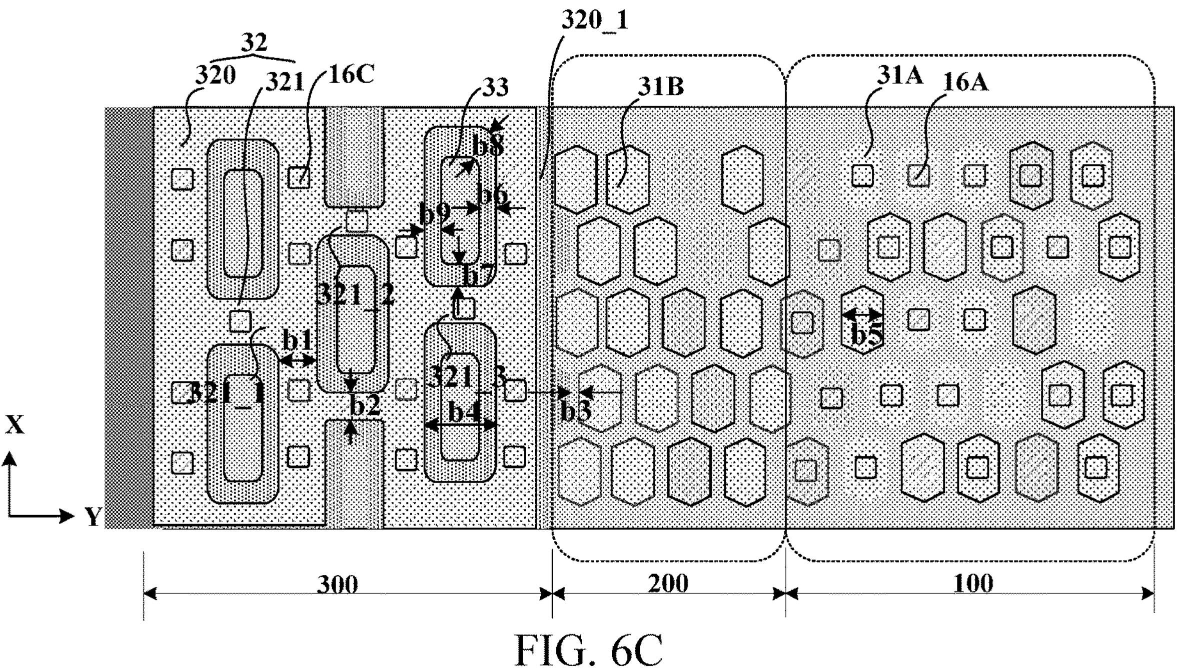

In an exemplary embodiment, as shown in FIGS. 6B and 6C, the plurality of first cathode voltage lines 320 extends along the first direction X and the plurality of second cathode voltage lines 321 extends along the second direction Y, the first direction X intersecting the second direction Y.

In an exemplary embodiment, for both sides of the lateral direction of the display device, the first direction X is a row direction and the second direction Y is a column direction. For both sides of the longitudinal direction of the display device, the first direction X is a column direction and the second direction Y is a row direction. That is, the first direction is a direction parallel to an edge of the display substrate.

In an exemplary embodiment, the first direction X is perpendicular to the second direction Y.

In an exemplary embodiment, as shown in FIG. 6A, the silicon-based substrate 10 includes the power supply electrode 301, and the cathode voltage lines 32 are connected to the power supply electrode 301 through metal vias (i.e., second conductive posts 13B and fifth conductive posts 16C described hereinafter, and in other exemplary embodiments, the metal vias are the second conductive posts 13B described hereinafter when no reflective layer is provided). Illustratively, the metal vias may be wolfram holes.

As shown in FIGS. 6B to 6E, in the embodiment of the present disclosure, the cathode voltage lines 32 are connected to the power supply electrode 301 through the metal vias, that is, the first cathode voltage lines 320 may be connected to the power supply electrode 301 through the metal vias, or the second cathode voltage lines 321 may be connected to the power supply electrode 301 through the metal vias. The specific positions of the metal vias may be adjusted according to the actual needs of electrical connection. For example, the metal vias are located within an area covered by the first cathode voltage lines 320 or within an area covered by the second cathode voltage lines 321 between adjacent first cathode voltage lines 320, the embodiment of the present disclosure is not limited thereto.

In an exemplary embodiment, on a plane parallel to the display substrate, the length of a metal via may be between 0.3 μm and 0.5 μm, and the width of the metal via may be between 0.3 μm and 0.5 μm. Illustratively, the length of the metal via may be 0.4 μm, and the width of the metal via may be 0.4 μm.

In an exemplary embodiment, as shown in FIGS. 6B and 6C, orthographic projections of the cathode voltage lines 32 on the silicon-based substrate 10 overlays orthographic projections of the metal vias on the silicon-based substrate 10.

Figure 6D:
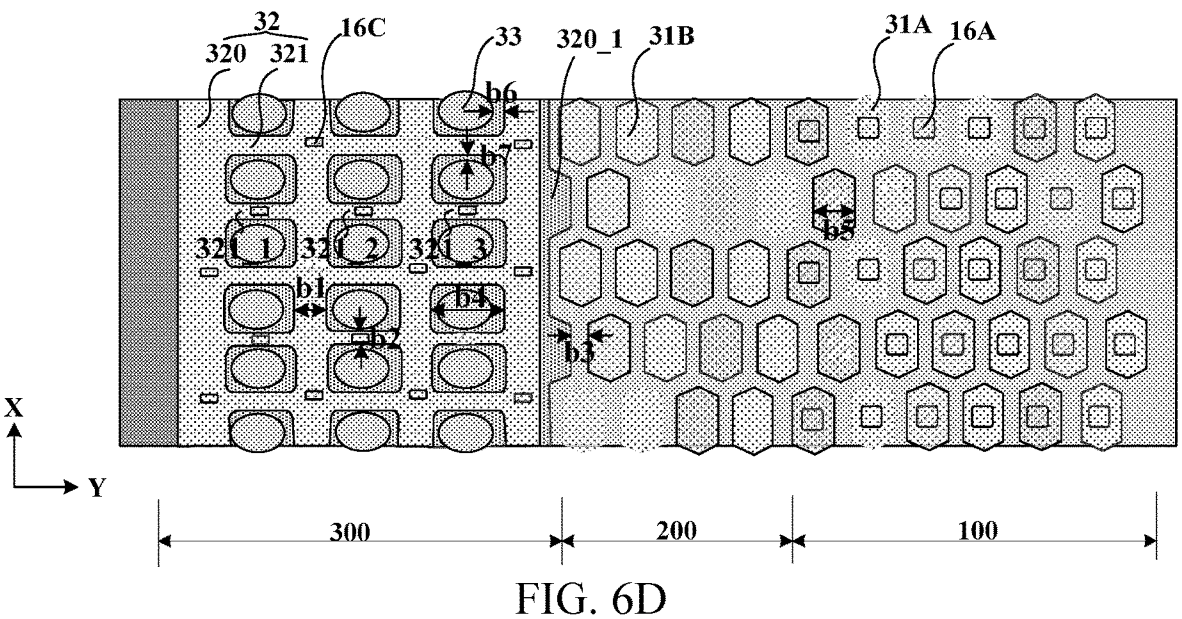
Figure 6E:
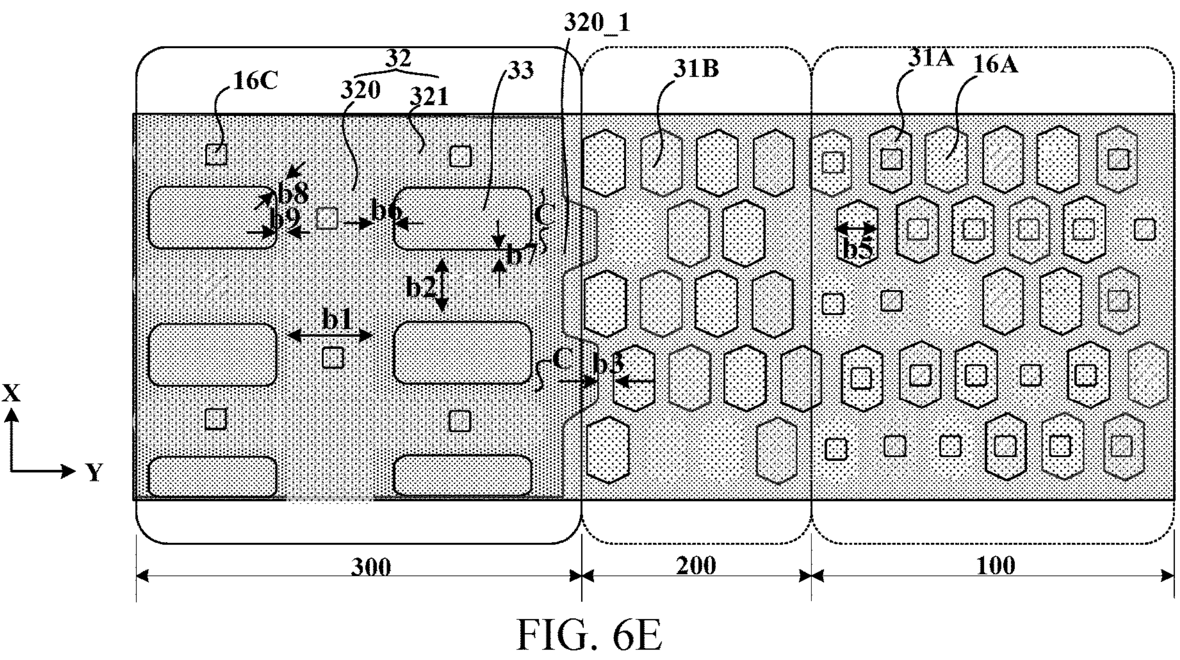

In an exemplary embodiment, as shown in FIG. 6E, the width b1 of the first cathode voltage line 320 in a direction perpendicular to the first direction X is greater than the width b2 of the second cathode voltage line 321 in a direction perpendicular to the second direction Y.

In an exemplary embodiment, as shown in FIGS. 6B to 6E, at one side of the cathode loop area 300 close to the display area 100, the cathode voltage lines 32 form an edge 320_1 of a first zigzag structure, and an orthographic projection of the pixel definition layer on the substrate 10 overlays an orthographic projection of the edge 320_1 of the first zigzag structure on the substrate 10.

In some exemplary embodiments, as shown in FIGS. 5, 6A to 6D, the anode layer further includes the dummy anodes 31B located in the dummy pixel area 200, one side of the dummy anodes 31B close to the cathode loop area 300 forming an edge of a second zigzag structure, and the edge of the first zigzag structure being complementary to the edge of the second zigzag structure.

In some exemplary embodiments, as shown in FIG. 6E, the pixel definition layer in the cathode loop area 300 includes the third opening, which expose at least a portion of the first cathode voltage lines 320 and at least a portion of the second cathode voltage lines 321 (the positions of the third opening in the figure are the positions of the exposed first cathode voltage lines 320 and second cathode voltage lines 321). Edges of the second cathode voltage lines 321 exposed by the third opening close to the dummy pixel area 200 are smooth curved surfaces (i.e., areas C identified by dashed line boxes in FIG. 6E) protruding towards the dummy pixel area 200.

Figure 6F:
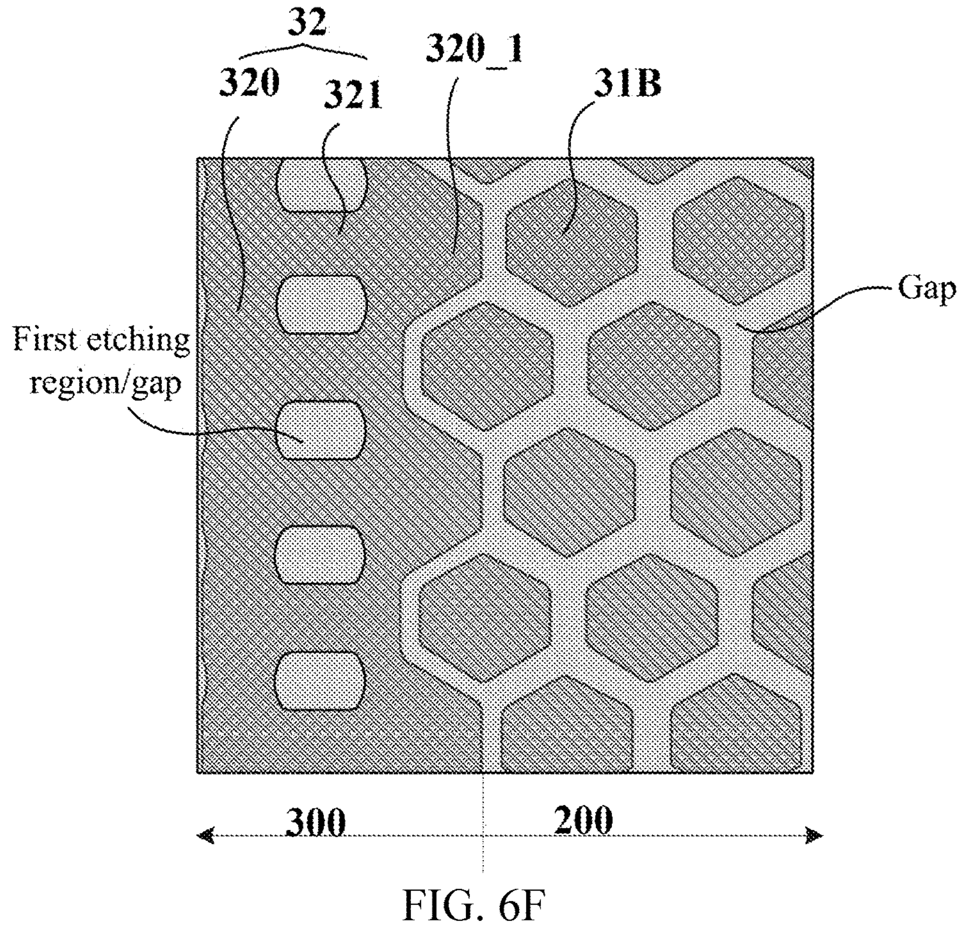
FIG. 6F is a schematic plan view of a display substrate after an anode layer is manufactured.
Figure 6G:
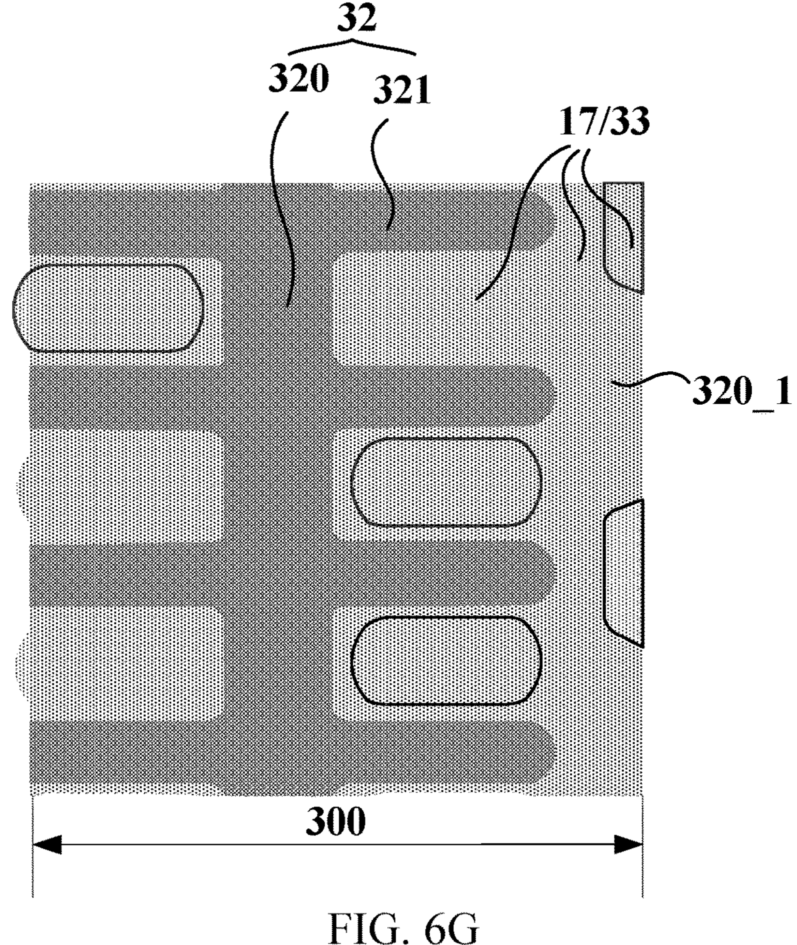
FIG. 6G is a schematic plan view of a display substrate after a pixel definition layer is manufactured.

FIG. 6F is a schematic plan view of a display substrate after an anode layer is manufactured in accordance with an embodiment of the present disclosure, and FIG. 6G is a schematic plan view of a display substrate after a pixel definition layer is manufactured in accordance with an embodiment of the present disclosure, where reference number 17 denotes a first pixel definition layer and reference number 33 denotes a second pixel definition layer. In some exemplary embodiments, the pixel definition layer may also be a single layer, the embodiment of the present disclosure is not limited thereto. As shown in FIGS. 6F and 6G, in the cathode loop area 300, the anode layer includes first etching regions located in areas surrounded by adjacent first cathode voltage lines 320 and adjacent second cathode voltage lines 321, and the pixel definition layer in the cathode loop area 300 overlays the first etching regions and cathode voltage lines located around the first etching regions.

In this embodiment, the cathode voltage lines 32 at the position of the edge 320_1 of the first zigzag structure are overlaid by the pixel definition layer and therefore do not have conductivity property. Only the first cathode voltage lines 320 and the second cathode voltage lines 321 exposed by the third openings have conductivity property, so as to be able to transmit low voltages to the cathode 35.

In some exemplary embodiments, as shown in FIGS. 6A to 6E, the pixel definition layer in the dummy pixel area 200 includes the second pixel openings that expose the dummy anodes 31B (the positions of the second pixel openings are the same as the positions of the dummy anodes 31B in the figure).

The distance b3 between an edge of the cathode voltage line close to the dummy pixel area 200 and an edge of the second pixel opening close to the cathode loop area 300 is less than the width b1 of the first cathode voltage line 320 along the direction perpendicular to the first direction X.

In some exemplary embodiments, as shown in FIGS. 6A to 6D, the distance b4 between adjacent first cathode voltage lines 320 is greater than the width b1 of the first cathode voltage line 320 along the direction perpendicular to the first direction X.

In some exemplary embodiments, as shown in FIGS. 6A to 6D, the pixel definition layer in the display area 100 includes the first pixel openings that expose the display anodes 31A (the positions of the first pixel openings are the same as the positions of the display anodes 31A in the figure).

The pixel definition layer in the cathode loop area 300 includes the third opening, the shape of which being different from that of the first pixel openings.

In some exemplary embodiments, as shown in FIGS. 6A to 6D, the width b1 of the first cathode voltage line 320 along the direction perpendicular to the first direction X is less than the width b5 of the first pixel opening along the direction perpendicular to the first direction X.

In an exemplary embodiment, as shown in FIGS. 6B and 6C, there are N first cathode voltage lines 320, a first one of the first cathode voltage lines 320 to an N-th one of the first cathode voltage lines 320 are arranged sequentially along a direction close to the display area 100, and the second cathode voltage lines 321 includes a first sub-second cathode voltage line 321_1 to an (N−1)-th sub-second cathode voltage line 321_N−1, wherein an i-th sub-second cathode voltage line 321_*i* is arranged between an i-th first cathode voltage line 320 and an (i+1)-th first cathode voltage line 320, i being a natural number between 1 and N−1.

In an exemplary embodiment, as shown in FIG. 6B, there are at least one i-th sub-second cathode voltage line 321_*i* and one (i+1)-th sub-second cathode voltage line 321_*i*+1 located on the same straight line.

In an exemplary embodiment, as shown in FIG. 6B, for any one i-th sub-second cathode voltage line 321_*i*, there is an (i+1)-th sub-second cathode voltage line 321_*i* located in the same straight line as the i-th sub-second cathode voltage line 321_*i*.

In an exemplary embodiment, as shown in FIG. 6B, the quantity of second cathode voltage lines 321 between two adjacent first cathode voltage lines 320 is the same as the quantity of second conductive posts 13B overlaid by each first cathode voltage line 320.

In an exemplary embodiment, as shown in FIG. 6C, neither any one i-th sub-second cathode voltage line 321_*i* nor any one (i+1)-th sub-second cathode voltage line 321_*i*+1 are located on the same straight line.

In an exemplary embodiment, a ratio of the area of the orthographic projections of the cathode voltage lines 32 on the silicon-based substrate 10 to the area of an orthographic projection of the cathode loop area 300 on the silicon-based substrate 10 is approximate to or the same as a ratio of the area of orthographic projections of the display anodes 31A on the silicon-based substrate 10 to the area of an orthographic projection of the display area 100 on the silicon-based substrate 10, that is, the distribution density of the cathode voltage lines 32 in the cathode loop area 300 is approximate to or the same as the distribution density of the display anodes 31A in the display area 100. "Approximate" in the embodiment of the present disclosure means that a difference between the distribution density of the cathode voltage lines 32 in the cathode loop area 300 and the distribution density of the display anodes 31A in the display area 100 is less than a preset difference threshold, which can be set according to actual needs, the embodiment of the present disclosure is not limited thereto.

In an exemplary embodiment, the anode layer includes a composite metal layer and a transparent oxide layer sequentially disposed on the silicon-based substrate 10. Illustratively, the composite metal layer includes titanium/aluminum/titanium (Ti/Al/Ti); the transparent oxide layer is indium tin oxide (ITO).

In an exemplary embodiment, the anode layer includes a composite metal layer or a transparent oxide layer disposed on the silicon-based substrate 10.

In an exemplary embodiment, as shown in FIGS. 6A, 6B, and 6C, the pixel definition layer includes the first pixel definition layer 17 and the second pixel definition layer 33, a surface of the first pixel definition layer 17 is flush with a surface of the anode layer, the anode layer includes a plurality of anode blocks, which may be the display anodes 31A, the dummy anodes 31B and the cathode voltage lines 32, the first pixel definition layer 17 is disposed in gaps between adjacent anode blocks, and the second pixel definition layer 33 is disposed on one side of the first pixel definition layer 17 away from the silicon-based substrate 10 and overlays the first pixel definition layer 17. As shown in FIG. 6F, in the display area 100 and the dummy pixel area 200, the gaps between the adjacent anode blocks are areas between adjacent display anodes 31A and areas between adjacent dummy anodes 31B; in the cathode loop area 300, the gaps between the adjacent anode blocks are areas surrounded by adjacent first cathode voltage lines 320 and adjacent second cathode voltage lines 321, that is, first etching areas described above.

In an exemplary embodiment, as shown in FIGS. 6B, 6C and 6D, in the cathode loop area 300, the pixel definition layer includes a plurality of pixel definition islands, each of which being disposed within an area surrounded by two adjacent first cathode voltage lines 320 and two adjacent second cathode voltage lines 321.

The pixel definition islands in FIGS. 6B and 6C are in the shape of a rounded rectangle, and the pixel definition islands in FIG. 6D are in the shape of an ellipse, however, the embodiment of the present disclosure is not limited thereto, the pixel definition islands may be in the shape of any of other shapes.

In other exemplary embodiments, there may be at least one pixel definition island in the cathode loop area 300. The at least one pixel definition island is not disposed within the area surrounded by two adjacent first cathode voltage lines 320 and two adjacent second cathode voltage lines 321.

In some exemplary embodiments, as shown in FIGS. 6B, 6C and 6D, the distance b6 between the pixel definition island and the first cathode voltage line 320 along the second direction Y is greater than the distance b7 between the pixel definition island and the second cathode voltage line 321 along the first direction X.

In some exemplary embodiments, as shown in FIGS. 6B and 6C, the shortest distance b8 between any of apex angles of the pixel definition island and the cathode voltage line within the third opening is greater than the shortest distance b9 between any of sides of the pixel definition island and the cathode voltage line within the third opening.

In an exemplary embodiment, on the plane parallel to the display substrate, the length of the pixel definition island may be between 3 μm and 5 μm, the width of the pixel definition island may be between 3 μm and 5 μm, and the spacing between adjacent pixel definition islands may be between 1 μm and 3 μm. Illustratively, the spacing between adjacent pixel definition islands may be 2 μm.

In an exemplary embodiment, as shown in FIG. 6A, an orthographic projection of the second pixel definition layer 33 on the silicon-based substrate 10 overlaps with the orthographic projections of the display anodes 31A on the silicon-based substrate 10.

In an exemplary embodiment, as shown in FIG. 6A, the display anodes 31A of the display light-emitting devices $P_a$, the dummy anodes 31B of the dummy light-emitting devices $P_b$ and the cathode voltage lines in the cathode loop area 300 may be disposed on the same layer and formed simultaneously through the same running of patterning process.

In an exemplary embodiment, as shown in FIG. 6A, the display light-emitting layer 34A of the display light-emitting devices $P_a$ and the dummy light-emitting layer 34B of the dummy light-emitting devices $P_b$ may be disposed on the same layer and formed simultaneously through the same running of an evaporation process.

In an exemplary embodiment, as shown in FIG. 6A, the cathodes of the display light-emitting devices $P_a$, the cathodes of the dummy light-emitting devices $P_b$ and the cathode in the cathode loop area 300 may be disposed on the same layer and are connected together to form an integrated structure.

A manufacturing process of the display substrate will be described below by way of example. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed by a certain material on a substrate using deposition, coating or other processes. If the "film" does not need the patterning processes in the entire manufacturing process, the "film" may also be called a "layer". If the "film" needs the patterning processes in the entire manufacturing process, the "film" is called a "film" before the patterning processes are performed and is called a "layer" after the patterning processes are performed. The "layer" processed by the patterning processes includes at least one "pattern". "A and B being disposed on the same layer" mentioned in the present disclosure means that A and B are formed simultaneously through the same running of the patterning process, and the "thickness" of the film layer is the dimension of the film layer in a direction perpendicular to the display device. In an exemplary embodiment of the present disclosure, "an orthographic projection of B being within the range of an orthographic projection of A" or "an orthographic projection of A containing an orthographic projection of B" means that the boundary of the orthographic projection of B falls within the boundary range of the orthographic projection of A, or the boundary of the orthographic projection of A overlaps with the boundary of the orthographic projection of B.

In an exemplary embodiment, the display device of the silicon-based OLED may include the display area 100, the dummy pixel area 200 located at the periphery of the display area 100 and the cathode loop area 300 located at one side of the dummy pixel area 200 away from the display area 100. Taking a display area including three display units as an example, the manufacturing process of the display device may include the following steps.

Figure 7:
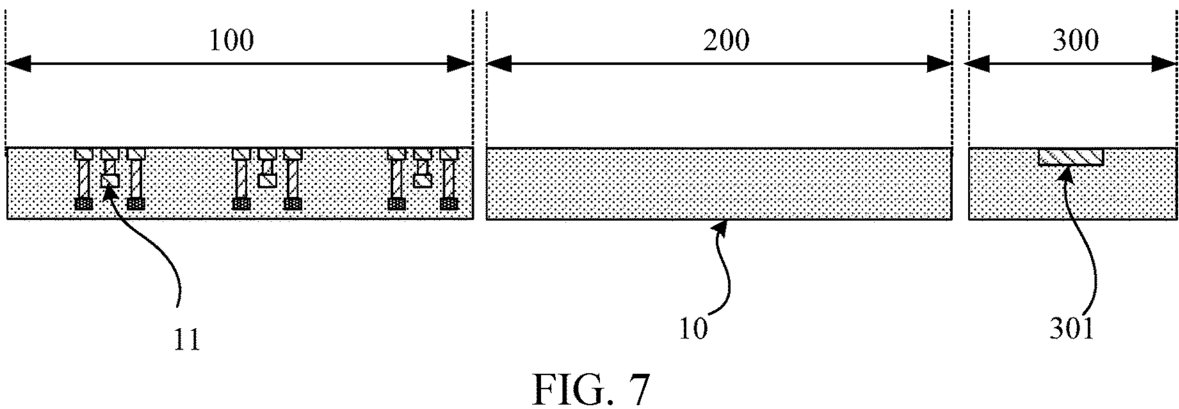
FIG. 7 is a schematic view of a display substrate after a silicon-based substrate is formed in accordance with an embodiment of the present disclosure.

(1) A silicon-based substrate 10 is manufactured. A display area 100 includes a plurality of display units, pixel driving circuits are integrated in the silicon-based substrate 10 of each display unit, and a power supply circuit is integrated in the silicon-based substrate 10 in a cathode loop area 300, as shown in FIG. 7. As an illustrative example, FIG. 7 illustrates three display units, i.e., a first display unit, a second display unit and a third display unit, in the display area 100, and illustrates driving transistors 11 included in the pixel driving circuits and a power supply electrode 301 in the cathode loop area 300. In an exemplary embodiment, the driving transistor 11 in the display area 100 includes an active layer, a gate electrode, a source electrode, a drain electrode and a gate connection electrode, the source electrode and the drain electrode are connected to the active layer through a conductive post, and the gate connection electrode is connected to the gate electrode through the conductive post. The silicon-based substrate 10 can be made using mature CMOS integrated circuit processes, the present disclosure is not limited thereto. After the manufacturing is completed, the source electrode, the drain electrode and the gate connection electrode in the display area 100 and the power supply electrode 301 in the cathode loop area 300 are exposed in the surface of the silicon-based substrate 10.

Figures 8, 9, 10, 11:
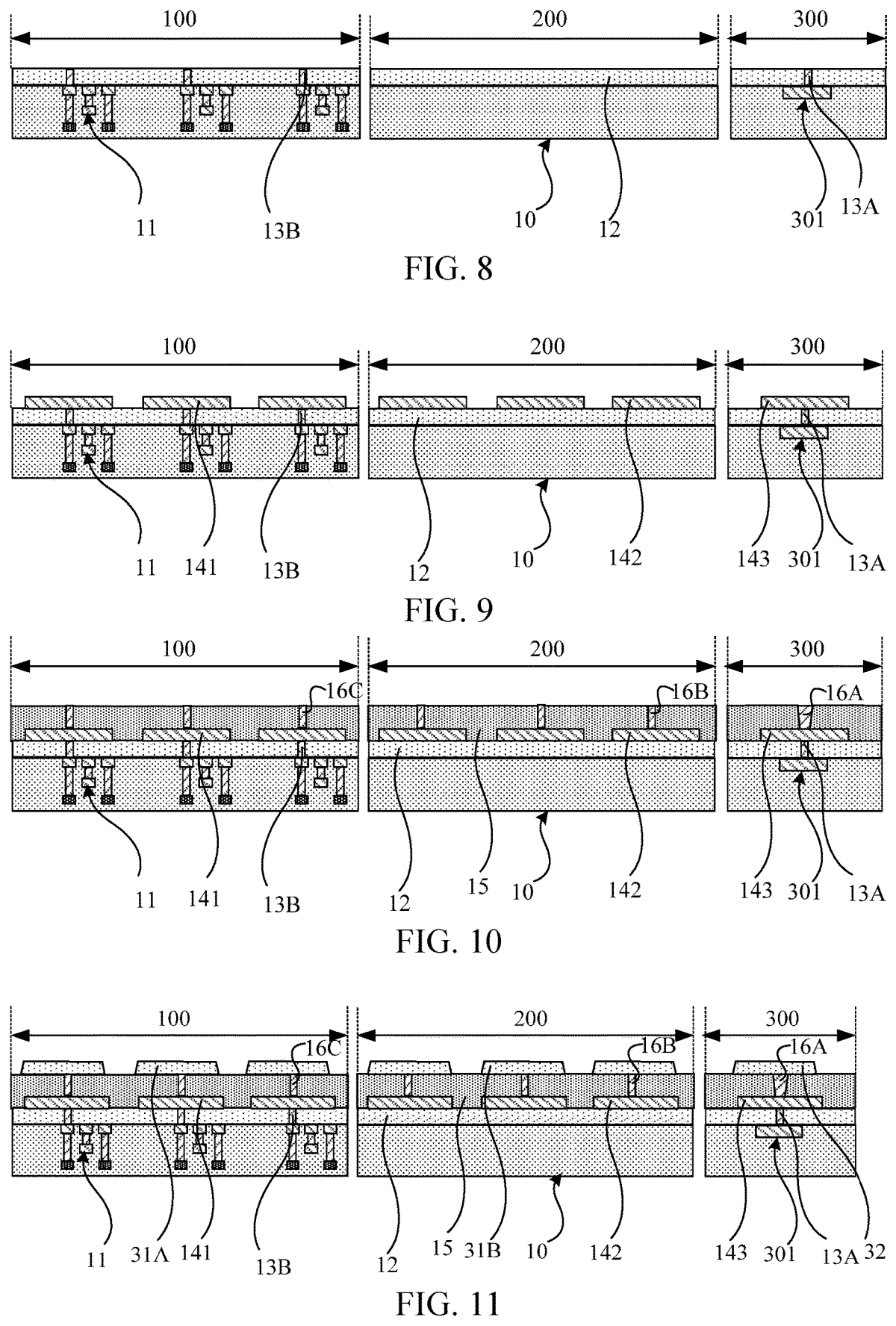

(2) A first insulating film is deposited on the silicon-based substrate 10, and the first insulating film is patterned through a the patterning process to form a pattern of a first insulating layer 12 overlaying the silicon-based substrate 10. A plurality of first vias is formed in the first insulating layer 12 in the display area 100 and at least one second via is formed in the first insulating layer 12 in the cathode loop area 300. The plurality of first vias each exposes a drain electrode of each display unit, and the second via exposes the power supply electrode 301. Then, a plurality of first conductive posts 13A is formed in the first vias in the first insulating layer 12, and a plurality of second conductive posts 13B is formed in the second via in the first insulating layer 12. The first conductive posts 13A in the first vias are connected to the drain electrodes of the corresponding display units where the first conductive posts 13A are located, and the second conductive posts 13B in the second via are connected to the power supply electrode 301 in the cathode loop area 300, as shown in FIG. 8. In an exemplary embodiment, the first conductive posts 13A and the second conductive posts 13B may be made of metal materials. After the first conductive posts 13A and the second conductive posts 13B are formed through a filling process, surfaces of the first insulating layer 12, the first conductive posts 13A and the second conductive posts 13B are corroded and rubbed through a polishing process to remove a portion of the thicknesses of the first insulating layer 12, the first conductive posts 13A and the second conductive posts 13B, so that the first insulating layer 12, the first conductive posts 13A and the second conductive posts 13B form a flush surface. In some possible implementations, the first conductive posts 13A and the second conductive posts 13B may be made of metal wolfram (W), and vias filled with wolfram metal are called wolfram vias (W-vias). In the case that the first insulating layer 12 is greater in thickness, the usage of the wolfram vias can guarantee the stability of a conductive pathway. Due to the maturity of processes of manufacturing the wolfram vias, the flatness of the surface of the resulting first insulating layer 12 is good, which is beneficial to decrease in contact resistance. The wolfram vias apply not only to a connection between the silicon-based substrate 10 and a reflective layer, but also to a connection between the reflective layer and an anode layer and connections between other wiring layers.

(3) A first metal film is deposited on the silicon-based substrate 10, on which the aforementioned structures are formed, and the first metal film is patterned through a patterning process to form a pattern of the reflective layer on the first insulating layer 12. The reflective layer includes a plurality of first reflective electrodes 141 disposed in the display area 100, a plurality of second reflective electrodes 142 disposed in the dummy pixel area 200 and a plurality of third reflective electrodes 143 disposed in the cathode loop area 300. The first reflective electrodes 141 are connected to the drain electrodes through the first conductive posts 13A, the second reflective electrodes 142 are not connected to other signal lines, and the third reflective electrodes 143 are connected to the power supply electrode 301 through the second conductive posts 13B, as shown in FIG. 9. In an exemplary embodiment, the first reflective electrode 141 of each display unit is used to form a microcavity structure together with a cathode subsequently formed. Light directly emitted by the organic light-emitting layer and light reflected by the reflective electrodes interfere with each other using the strong reflection effect of the reflective electrodes, thereby improving the color gamut of the emergent light and increasing the luminance of the emergent light.

(4) A second insulating film is deposited on the silicon-based substrate 10, on which the aforementioned structures are formed, and the second insulating film is patterned through a patterning process to form a pattern of the second insulating layer 15 overlaying the silicon-based substrate 10. A plurality of third vias are formed in the second insulating layer 15 in the display area 100, a plurality of fourth vias are formed in the second insulating layer 15 in the dummy pixel area 200, and at least one fifth via is formed in the second insulating layer 15 in the cathode loop area 300. The plurality of third vias expose the first reflective electrodes 141 in the display area 100 respectively, the plurality of fourth vias expose the second reflective electrodes 142 in the dummy pixel area 200 respectively, and the fifth via exposes the third reflective electrode 143 in the cathode loop area 300. Then, a plurality of third conductive posts 16A are formed in the third vias in the second insulating layer 15, a plurality of fourth conductive posts 16B are formed in the fourth vias in the second insulating layer 15, and a plurality of fifth conductive posts 16C are formed in the fifth via in the second insulating layer 15. The third conductive posts 16A in the third vias are connected to the first reflective electrodes 141 of the display unit in which the third conductive posts 16A are located, the fourth conductive posts 16B in the fourth vias are connected to the second reflective electrodes 142 in the dummy pixel area 200, and the fifth conductive posts 16C in the fifth via are connected to the third reflective electrodes 143 in the cathode loop area 300, as shown in FIG. 10. In an exemplary embodiment, the third conductive posts 16A, the fourth conductive posts 16B and the fifth conductive posts 16C may be made of metal materials. After the third conductive posts 16A, the fourth conductive posts 16B and the fifth conductive posts 16C are formed through the filling process, a polish process may be performed, surfaces of the second insulating layer 15, the third conductive posts 16A, the fourth conductive posts 16B and the fifth conductive posts 16C are corroded and rubbed through the polishing process to remove a portion of the thicknesses of the second insulating layer 15, the third conductive posts 16A, the fourth conductive posts 16B and the fifth conductive posts 16C, so that the second insulating layer 15, the third conductive posts 16A, the fourth conductive posts 16B and the fifth conductive posts 16C form a flush surface. In some possible implementations, the third conductive posts 16A, the fourth conductive posts 16B and the fifth conductive posts 16C may be made of metal wolfram (W).

(5) A composite metal film and a transparent conductive film are deposited sequentially on the silicon-based substrate 10, on which the aforementioned structures are formed, and the composite metal film and the transparent conductive film are patterned through a patterning process to form a pattern of the anode layer on the second insulating layer 15 in the display area 100, the dummy pixel area 200 and the cathode loop area 300. The anode layer includes display anodes 31A disposed in the display area 100, dummy anodes 31B disposed in the dummy pixel area 200 and cathode voltage lines 32 disposed in the cathode loop area 300. The display anodes 31A are connected to the first reflective electrodes 141 through the third conductive posts 16A, the dummy anodes 31B are connected to the second reflective electrodes 142 through the fourth conductive posts 16B, and the cathode voltage lines 32 are connected to the third reflective electrodes 143 through the fifth conductive posts 16C, as shown in FIG. 11. In the display area 100, the display anodes 31A are connected to the first reflective electrodes 141 through the third conductive posts 16A, and the first reflective electrodes 141 are connected to the drain electrodes of the driving film transistors 11 through the first conductive posts 13A, thus electrical signals provided by the pixel driving circuits are transmitted to the display anodes 31 through the first reflective electrodes 141. The first reflective electrodes 141, on the one hand, form conductive pathways between the pixel driving circuits and the anodes, on the other hand, form a microcavity structure, which is not only beneficial to control of the light-emitting devices by the pixel driving circuits, but also makes the structure of the display substrate more compact, which is conducive to miniaturization of the display device of the silicon-based OLED. In the cathode loop area 300, the cathode voltage lines 32 are connected to the third reflective electrodes 143 through the fifth conductive posts 16C, and the third reflective electrode 143 are connected to the power supply electrode 301 through the second conductive posts 13B, thus low voltage signals provided by the power supply electrode 301 are transmitted to the cathode voltage lines 32 through the third reflective electrode 143.

Illustratively, materials of the anode layer may include a composite metal layer and a transparent oxide layer sequentially disposed on the silicon-based substrate 10 or may include only a single composite metal layer or a single transparent oxide layer. Illustratively, the composite metal layer may include titanium/aluminum/titanium (Ti/Al/Ti); the transparent oxide layer may be indium tin oxide (ITO). The composite metal layer and the transparent oxide layer can be formed through one running of etching after being deposited inside two chambers respectively.

Illustratively, the cathode voltage lines 32 includes a plurality of first cathode voltage lines 320 and a plurality of second cathode voltage lines 321, and each second cathode voltage line 321 is arranged between and connected to two adjacent first cathode voltage lines 320.

Figure 12:
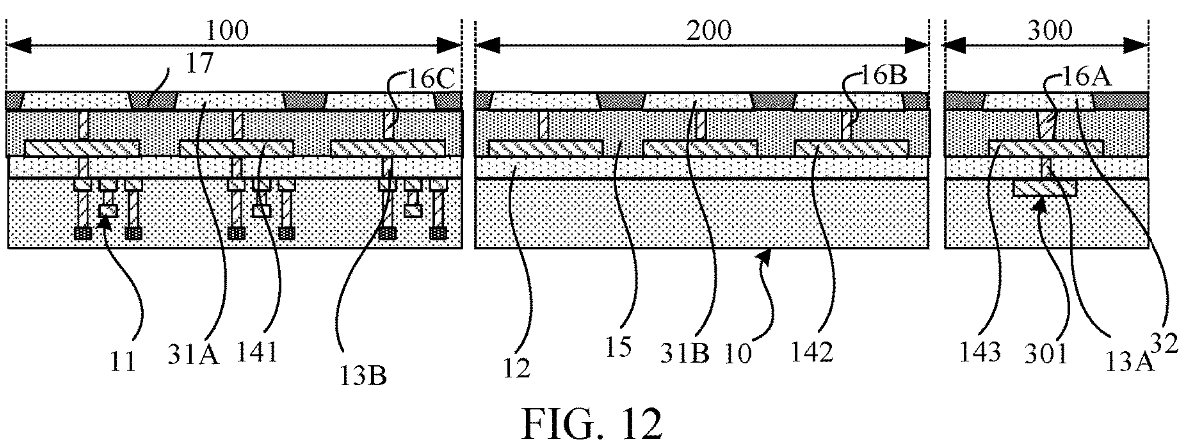
FIG. 12 is a schematic view of a display substrate after a pattern of a first pixel definition layer is formed in accordance with an embodiment of the present disclosure.

(6) A third insulating film is deposited on the silicon-based substrate 10, on which the aforementioned structures are formed, and the third insulating film is indiscriminately etched using an etching gas to form a pattern of a first pixel definition layer 17 filled in gaps of the anode layer, as shown in FIG. 12.

(7) A pixel definition film is coated on the silicon-based substrate 10, on which the aforementioned structures are formed, and a pattern of a second pixel definition layer (PDL) 33 is formed in the display area 100, the dummy pixel area 200 and the cathode loop area 300 through masking, exposure and development processes. First pixel openings which expose the surfaces of the display anodes 31A are provided in the second pixel definition layer 33 in the display area 100, second pixel openings which expose the surfaces of the dummy anodes 31B are provided in the second pixel definition layer 33 in the dummy pixel area 200, and third openings which expose the surfaces of a portion of cathode voltage lines 32 are provided in the second pixel definition layer 33 in the cathode loop area 300. Restriction to an anode aperture ratio is achieved through the first pixel openings, the second pixel openings are mainly used to increase the etching uniformity of the display area 100 and the dummy pixel area 200, and the third openings can prevent metal in the cathode voltage lines 32 from being corroded.

Illustratively, the first pixel definition layer 17 is disposed in gaps between adjacent anode blocks, and the second pixel definition layer 33 is disposed on one side of the first pixel definition layer 17 away from the silicon-based substrate 10 and overlays the first pixel definition layer 17. Thus, the first pixel definition layer 17 can be prevented from being etched again.

The steps (6) and (7) in the embodiment of the present disclosure may be combined into one step, i.e., only a single pixel definition layer is formed, the embodiment of the present disclosure is not limited thereto.

Illustratively, in the cathode loop area 300, the pixel definition layer includes a plurality of pixel definition islands (distributed in the shape of an island), each of which being disposed within an area surrounded by two adjacent first cathode voltage lines 320 and two adjacent second cathode voltage lines 321. The pixel definition islands not only improve cathode lap joint (decrease cathode lap-joint resistance), and their rugged structures (in the embodiment of the present disclosure, a part of the pixel definition islands overlay a portion of the cathode voltage lines, and the other part of the pixel definition islands overlay the first etching areas, and the height of the pixel definition islands overlaying the portion of the cathode voltage lines from the substrate is larger than the height of the pixel definition islands overlaying the first etching areas from the substrate) are also beneficial to the subsequent film encapsulation structure.

Figure 13:
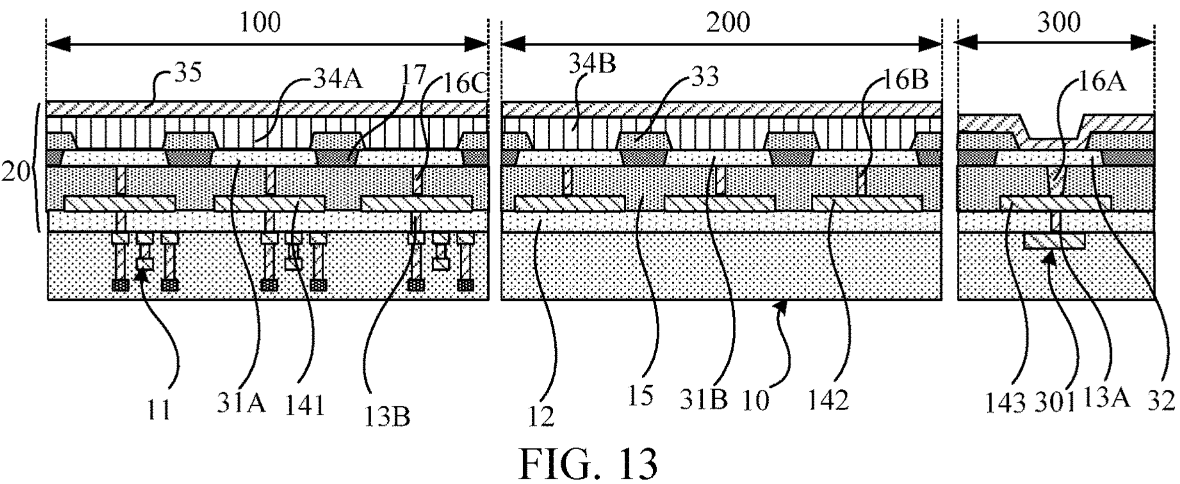
FIG. 13 is a schematic view of a display substrate after a pattern of a cathode is formed in accordance with an embodiment of the present disclosure.

Subsequently, a display light-emitting layer 34A and a dummy light-emitting layer 34B are formed in the display area 100 and the dummy pixel area 200, respectively, and then a cathode 35 is formed in the display area 100, the dummy pixel area 200 and the cathode loop area 300. Illustratively, the cathode 35 is in the shape of a whole surface. In the display area 100, the display light-emitting layer 34A is connected to the display anodes 31A through the first pixel openings, and the cathode 35 is connected to the display light-emitting layer 34A; in the dummy pixel area 200, the dummy light-emitting layer 34B is connected to the dummy anodes 31B through the second pixel openings, and the cathode 35 is connected to the dummy light-emitting layer 34B; in the cathode loop area 300, the cathode 35 is connected to the cathode voltage lines 32 through the third opening, as shown in FIG. 13. In an exemplary embodiment, the cathode 35 is a semi-transparent and semi-reflective electrode, and form a microcavity structure together with the formed first reflective electrodes 141 as described above.

In the aforementioned manufacturing process, the first insulating film, the second insulating film and the third insulating film may be made of silicon oxide (SiOx), silicon nitride (SiNx) or silicon oxynitride (SiON), and may be a single-layer structure or a multi-layer composite structure. The first metal film may be made of a metal material, such as silver (Ag), copper (Cu), aluminum (Al) or molybdenum (Mo), or may be made of an alloy material formed by metals, such as aluminum neodymium alloy (AlNd) or molybdenum niobium alloy (MoNb). The alloy material may be a single-layer structure or a multi-layer composite structure, such as a composite structure of Mo/Cu/Mo. The transparent conductive film may be made of indium tin oxide (ITO) or indium zinc oxide (IZO), or be a composite structure of ITO/Ag/ITO. The pixel definition layer may be made of polyimide, acrylic or polyethylene terephthalate.

Figure 14:
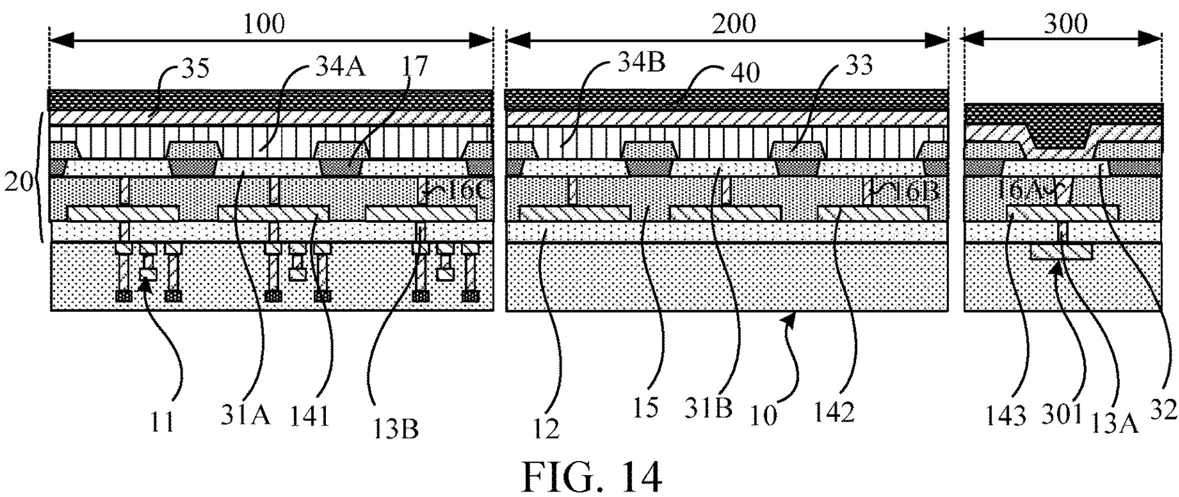
FIG. 14 is a schematic view of a display substrate after a pattern of an encapsulation layer is formed in accordance with an embodiment of the present disclosure.

(8) On the silicon-based substrate 10 on which the aforementioned structures are formed, a pattern of an encapsulation layer 40 is formed in the display area 100, the dummy pixel area 200 and the cathode loop area 300, and the first encapsulation layer 40 is a film encapsulation structure, as shown in FIG. 14.

(9) On the silicon-based substrate 10 on which the aforementioned structures are formed, a pattern of a color filter layer 50 is formed in the display area 100, the dummy pixel area 200, the cathode loop area 300 and a portion of a metal wiring area 400. The color filter layer 50 in the display area 100 includes a first color unit 53, a second color unit 54 and a third color unit 55 separated from each other or overlapping with each other. In an exemplary embodiment, the color units in the display area 100 can overlap with each other to form a black matrix, or a black matrix is provided between the color units. The color filter layer 50 in the dummy pixel area 200 and the cathode loop area 300 may include a first color unit 53 and a second color unit 54 stacked, as shown in FIG. 6A. In an exemplary embodiment, the first color unit may be a green unit G, the second color unit may be a red unit R, and the third color unit may be a blue unit B. In some possible implementations, the manufacturing process of the color film layer 50 includes: forming the blue unit B firstly, then forming the red unit R, and then forming the green unit G. Because the adhesivity of a blue color film is relatively high, forming the blue unit B firstly can reduce the possibility of peeling the color film layer 50 from the cathode. Because the adhesivity of the red unit R is relatively low but its fluidity is good, the quantity of bubbles on the surfaces of the blue unit B and the red unit R away from the cathode can be reduced in the process of forming the red unit R, thereby improving the uniformity of the thickness of the film at a position where the blue unit B and the red unit R overlap with each other. Because the base material of the green unit G is approximately the same as that of the red unit R, the adhesion between the green unit G and the red unit R is relatively high, thereby reducing the possibility of peeling the color film layer 50 from the cathode. In some possible implementations, the color film layer 50 may include other color units, such as a white or yellow unit.

In a subsequent process, a pattern of a second encapsulation layer is formed in the display area 100, the dummy pixel area 200 and the cathode loop area 300, and then a cover plate is formed using a sealing process. The cover plate is fixed to the silicon-based substrate 10 through a sealant. Because the silicon-based substrate 10, the cover plate and the sealant together form an enclosed space, a barrier against water and oxygen is provided, such that the service life of the display substrate of the silicon-based OLED is greatly prolonged. Subsequently, the formed display motherboard is cut to form an individual display substrate.

It can be seen from the structure of the display substrate in accordance with the present disclosure and the manufacturing process thereof that in the present disclosure, designing the shape of the cathode voltage lines into a mesh can not only ensure that the etching load of the cathode voltage lines in the cathode loop area 300 is approximate to the etching load of the display anodes in the display area, but also improve the problem of lap joint of the cathode voltage lines and metal of the cathode, thereby reducing the cathode lap joint resistance, decreasing the IR Drop of the display area, and improving the display effect.

The manufacturing process in the present disclosure can be implemented using mature manufacturing equipment, and its procedure is simple without adding the mask process, and can be implemented by only changing cathode loop metal arrangement. The manufacturing process has high compatibility, simple process flow, easy periodic maintenance of the equipment, high production efficiency, low production cost and high yield rate, and facilitates mass production. The manufactured display substrate can be applied to virtual reality devices or augmented reality devices or other types of display devices, and has good application prospects.

The structure shown in the present disclosure and the manufacturing process thereof are described by way of example merely. In an exemplary embodiment, corresponding structures may be changed and patterning processes may be added or reduced according to actual needs, the present disclosure is not limited thereto.

Figure 15:
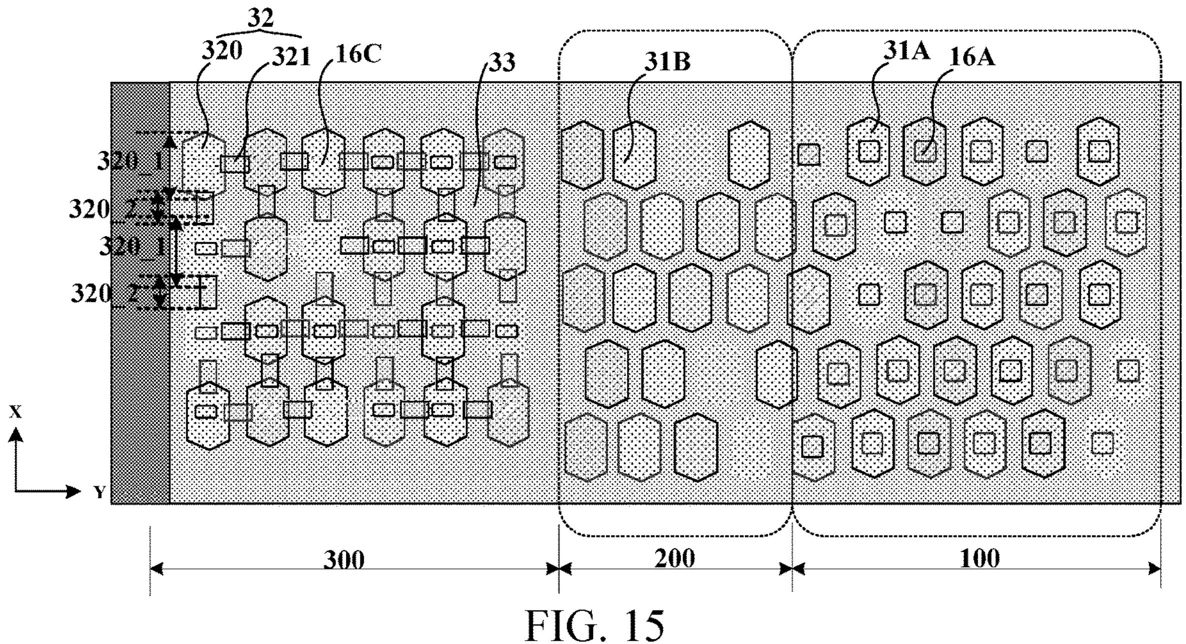
FIG. 15 is a schematic view of another enlarged structure of the area B in FIG. 5.

FIG. 15 is a schematic view of another enlarged structure of the area B in FIG. 5. In other exemplary embodiments, as shown in FIG. 15, at least one of the first cathode voltage lines 320 includes first subparts 320_1 and second subparts 320_2 alternately arranged along the first direction X and connected to each other, and the first subparts 320_1 and the display anodes 31A are in the same shape.

In some exemplary embodiments, as shown in FIG. 15, orthographic projections of the first subparts 320_1 on the silicon-based substrate 10 overlay orthographic projections of the second conductive posts 13B on the silicon-based substrate 10.

In some exemplary embodiments, as shown in FIG. 15, both the first subparts 320_1 and the display anodes 31A are in the shape of a regular hexagon, however, the embodiment of the present disclosure is not limited thereto.

In some exemplary embodiments, as shown in FIG. 15, a second subpart 320_2 is a connection structure disposed between two adjacent first subparts 320_1 along the first direction X.

In some exemplary embodiments, as shown in FIG. 15, a second cathode voltage line 321 is a connection structure disposed between two adjacent first subparts 320_1 along the second direction Y.

The present disclosure further provides a manufacturing method for a display substrate. In an exemplary embodiment, the display device includes a display area and a cathode loop area located outside of the display area, and the manufacturing method includes:

providing a silicon-based substrate, the silicon-based substrate including pixel driving circuits and a power supply electrode;

forming sequentially an insulating layer and a light-emitting structure layer on the substrate, wherein the insulating layer includes first conductive posts and second conductive posts, the light-emitting structure layer includes an anode layer, a pixel definition layer, an organic light-emitting layer and a cathode, the anode layer includes display anodes located in the display area and cathode voltage lines located in the cathode loop area, the cathode is connected to the cathode voltage lines, and the display anodes are connected to the pixel driving circuits through the first conductive posts; the cathode voltage lines include a plurality of first cathode voltage lines extending along a first direction and a plurality of second cathode voltage lines extending along a second direction, the first direction being a direction parallel to an edge of the display substrate, and the second direction intersecting the first direction; at least one second cathode voltage line is arranged between two adjacent first cathode voltage lines and connected to the two adjacent first cathode voltage lines; the cathode voltage lines are connected to the power supply electrode through the second conductive posts, and orthographic projections of the cathode voltage lines on the substrate overlay orthographic projections of the second conductive posts on the substrate.

The present disclosure further provides a display device including the display substrate described in any one of the embodiments of the present disclosure. The display device may be a virtual reality device, an augmented reality device or a near-to-eye display device, or may be a mobile phone, a tablet computer, a television, a display, a notebook computer, a digital photo frame or a navigator, or any other product or component with a display function.

Although the embodiments of the present disclosure are disclosed as above, the contents described are only intended to easily understand the embodiments of the present disclosure, and are not intended to limit the present disclosure. Any skilled person in the art to which the present disclosure pertains may make any modifications and alterations in forms and details of implementation without departing from the spirit and scope of the present disclosure. However, the patent protection scope of the present disclosure should be subject to the scope defined by the appended claims.

The invention claimed is:

1. A display substrate, comprising a substrate and a display area and a cathode loop area disposed on the substrate, wherein:

the cathode loop area is located outside the display area;

in a direction perpendicular to the display substrate, the display substrate comprises an insulating layer disposed on the substrate and a light-emitting structure layer disposed on the insulating layer, the light-emitting structure layer comprises an anode layer, a pixel definition layer, an organic light-emitting layer and a cathode, the anode layer comprises a plurality of display anodes located in the display area and cathode voltage lines located in the cathode loop area, the cathode is connected to the cathode voltage lines, the substrate comprises a power supply electrode and pixel driving circuits, the insulating layer comprises first conductive posts and second conductive posts, and the display anodes are connected to the pixel driving circuits through the first conductive posts;

the cathode voltage lines comprise a plurality of first cathode voltage lines extending along a first direction and a plurality of second cathode voltage lines extending along a second direction, the first direction being a direction parallel to an edge of the display substrate, and the second direction intersecting the first direction;

at least one second cathode voltage line is arranged between two adjacent first cathode voltage lines and connected to the two adjacent first cathode voltage lines; and the cathode voltage lines are connected to the power supply electrode through the second conductive posts, and orthographic projections of the cathode voltage lines on the substrate overlay orthographic projections of the second conductive posts on the substrate-; and in the cathode loop area, the anode layer comprises first etching regions located in areas surrounded by adjacent first cathode voltage lines and adjacent second cathode voltage lines, and the pixel definition layer in the cathode loop area overlays the first etching regions and cathode voltage lines located around the first etching regions.

2. The display substrate according to claim 1, wherein a width of the first cathode voltage line in a direction perpendicular to the first direction is greater than a width of the second cathode voltage line in a direction perpendicular to the second direction.

3. The display substrate according to claim 1, wherein at a side of the cathode loop area close to the display area, the cathode voltage lines is formed with an edge of a first zigzag structure, and an orthographic projection of the pixel definition layer on the substrate overlays an orthographic projection of the edge of the first zigzag structure on the substrate.

4. The display substrate according to claim 3, further comprising a dummy pixel area disposed between the display area and the cathode loop area, wherein the anode layer further comprises dummy anodes located in the dummy pixel area, and the dummy anodes are disposed to be floating.

5. The display substrate according to claim 4, wherein a side of the dummy anodes close to the cathode loop area is formed with an edge of a second zigzag structure, and the edge of the first zigzag structure and the edge of the second zigzag structure are complementary structures.

6. The display substrate according to claim 4, wherein the pixel definition layer in the cathode loop area comprises a third opening, which exposes at least a portion of the first cathode voltage lines and at least a portion of the second cathode voltage lines, edges of the second cathode voltage lines exposed by the third opening close to the dummy pixel area are smooth curved surfaces protruding towards the dummy pixel area.

7. The display substrate according to claim 4, wherein the pixel definition layer in the dummy pixel area comprises a second pixel opening; and a distance between an edge of the cathode voltage lines close to the dummy pixel area and an edge of the second pixel opening close to the cathode loop area is less than a width of the first cathode voltage lines along a direction perpendicular to the first direction.

8. The display substrate according to claim 1, wherein a distance between adjacent first cathode voltage lines is greater than a width of the first cathode voltage lines along a direction perpendicular to the first direction.

9. The display substrate according to claim 1, wherein the pixel definition layer in the display area comprises a first pixel opening; and a width of the first cathode voltage lines along a direction perpendicular to the first direction is less than a width of the first pixel opening along the direction perpendicular to the first direction.

10. The display substrate according to claim 1, wherein a quantity of second cathode voltage lines between two adjacent first cathode voltage lines is the same as a quantity of second conductive posts overlaid by each first cathode voltage line.

11. The display substrate according to claim 1, wherein a sub-second cathode voltage line and a second conductive post are arranged on a same straight line.

12. The display substrate according to claim 1, wherein the pixel definition layer comprises a first pixel definition layer and a second pixel definition layer, a surface of the first pixel definition layer away from the substrate is flush with a surface of the anode layer away from the substrate, the first pixel definition layer is disposed in gaps in the anode layer, and the second pixel definition layer is disposed on a side of the first pixel definition layer away from the substrate and overlays the first pixel definition layer.

13. The display substrate according to claim 12, wherein in the display area, an orthographic projection of the second pixel definition layer on the substrate is overlapped with orthographic projections of the display anodes on the substrate.

14. The display substrate according to claim 1, wherein the pixel definition layer in the cathode loop area comprises a plurality of pixel definition islands, a distance between the pixel definition islands and the first cathode voltage lines along the second direction being greater than a distance between the pixel definition islands and the second cathode voltage lines along the first direction.

15. The display substrate according to claim 14, wherein the pixel definition layer in the cathode loop area comprises a third opening, which exposes at least a portion of the first cathode voltage lines and at least a portion of the second cathode voltage lines, the pixel definition islands are in a shape of a rounded rectangle, and a shortest distance between any of apex angles of a pixel definition island and a cathode voltage line within the third opening is greater than a shortest distance between any of sides of a pixel definition island and the cathode voltage line within the third opening.

16. The display substrate according to claim 1, wherein there are N first cathode voltage lines, a first one of the first cathode voltage lines to an N-th one of the first cathode voltage lines are arranged sequentially along a direction close to the display area; and the second cathode voltage lines includes a first sub-second cathode voltage line to an (N−1)-th sub-second cathode voltage line, and an i-th sub-second cathode voltage line is arranged between an i-th first cathode voltage line and an (i+1)-th first cathode voltage line, i being a natural number between 1 and N−1.

17. The display substrate according to claim 16, wherein there are at least one i-th sub-second cathode voltage line and one (i+1)-th sub-second cathode voltage line located on a same straight line.

18. The display substrate according to claim 16, wherein neither any one i-th sub-second cathode voltage line nor any one (i+1)-th sub-second cathode voltage line are located on a same straight line.

19. A display device, comprising the display substrate according to claim 1.

* * * * *